US012684922B2

(12) United States Patent
Shim et al.

(10) Patent No.: US 12,684,922 B2
(45) Date of Patent: Jul. 14, 2026

(54) DISPLAY DEVICE AND MANUFACTURING METHOD OF THE SAME

(71) Applicant: Samsung Display Co., Ltd., Yongin-si (KR)

(72) Inventors: Yiseop Shim, Suwon-si (KR); Suk Hoon Kang, Seoul (KR); Kyuwon Jo, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 760 days.

(21) Appl. No.: 17/986,275

(22) Filed: Nov. 14, 2022

(65) Prior Publication Data

US 2023/0261032 A1 Aug. 17, 2023

(30) Foreign Application Priority Data

Feb. 14, 2022 (KR) ........................ 10-2022-0019085

(51) Int. Cl.
| | |
|---|---|
| *H10H 29/14* | (2025.01) |
| *G02B 5/20* | (2006.01) |
| *H10H 20/01* | (2025.01) |
| *H10H 20/80* | (2025.01) |
| *H10H 20/851* | (2025.01) |

(52) U.S. Cl.
CPC ........ *H10H 29/142* (2025.01); *H10H 20/851* (2025.01); *G02B 5/201* (2013.01); *H10H 20/0361* (2025.01); *H10H 20/882* (2025.01)

(58) Field of Classification Search
CPC ............... H10H 29/142; H10H 20/851; H10H 20/0361; H10H 20/882; H10H 20/84; H10H 20/855; H10H 20/01; H10H 20/8511; H10H 20/8514; G02B 5/201; H01L 25/167; H01L 25/0753; H10K 50/854; H10K 59/38; H10K 71/00; H10W 90/00

See application file for complete search history.

(56) References Cited

U.S. PATENT DOCUMENTS

| | | | |
|---|---|---|---|
| 10,048,530 B1 | 8/2018 | Kim et al. | |
| 11,215,859 B2 | 1/2022 | Lee et al. | |
| 11,985,880 B2 | 5/2024 | Yang et al. | |
| 2014/0168572 A1* | 6/2014 | Iwata ..................... | H05B 33/10 |
| | | | 349/61 |

(Continued)

FOREIGN PATENT DOCUMENTS

| | | |
|---|---|---|
| KR | 1020170032318 A | 3/2017 |
| KR | 1020190014140 A | 2/2019 |

(Continued)

*Primary Examiner* — Jonathan Han
(74) *Attorney, Agent, or Firm* — CANTOR COLBURN LLP

(57) ABSTRACT

A display device includes a display panel, and a color conversion member disposed on the display panel. The color conversion member includes a plurality of partition walls disposed on the display panel and spaced apart from each other, and a color control part disposed between the plurality of partition walls. Each of the plurality of partition walls includes a first sub partition wall including a scattering body, and a second sub partition wall disposed on the first sub partition wall, and including a liquid repellent. The second sub partition wall has a higher light transmittance than the first sub partition wall.

20 Claims, 14 Drawing Sheets

(56)          References Cited

U.S. PATENT DOCUMENTS

| | | | | |
|---|---|---|---|---|
| 2020/0111842 A1* | 4/2020 | Kim | ..................... | H10K 59/173 |
| 2022/0123026 A1 | 4/2022 | Oh et al. | | |
| 2023/0209962 A1* | 6/2023 | Seong | .................. | H10K 59/877 |
| | | | | 257/40 |
| 2023/0413636 A1* | 12/2023 | Lee | ........................ | H10K 59/38 |

FOREIGN PATENT DOCUMENTS

| | | | |
|---|---|---|---|
| KR | 1020190057190 A | 5/2019 |
| KR | 1020200088954 A | 7/2020 |
| KR | 1020200130606 A | 11/2020 |
| KR | 1020210086867 A | 7/2021 |
| KR | 1020210127279 A | 10/2021 |

* cited by examiner

FIG. 2B

DISPLAY DEVICE AND MANUFACTURING METHOD OF THE SAME

This application claims priority to Korean Patent Application No. 10-2022-0019085, filed on Feb. 14, 2022, and all the benefits accruing therefrom under 35 U.S.C. § 119, the content of which in its entirety is herein incorporated by reference.

BACKGROUND

1. Field

The disclosure herein relates to a display device and a manufacturing method of the display device, and particularly, to a display device with improved display efficiency and reliability and a manufacturing method of the display device.

2. Description of the Related Art

A display panel may be classified into a transmissive display panel which selectively transmits source light generated from a light source and an emissive display panel which generates source light from the display panel itself. A display panel may include different types of light control patterns depending on pixels to generate color images. The light control patterns may transmit source light only in a partial wavelength range, or may convert colors of the source light. Some of the light control patterns may change the characteristics of light without changing the colors of the source light.

SUMMARY

The disclosure provides a display device with improved display efficiency and reliability.

The disclosure also provides a manufacturing method of a display device with improved display efficiency and reliability.

An embodiment of the invention provides a display device including a display panel, and a color conversion member disposed on the display panel, where the color conversion member includes a plurality of partition walls disposed on the display panel, and spaced apart from each other, and a color control part disposed between the plurality of partition walls, each of the plurality of partition walls includes a first sub partition wall including a scattering body, and a second sub partition wall disposed on the first sub partition wall, and including a liquid repellent, and the second sub partition wall has a higher light transmittance than the first sub partition wall.

In an embodiment, the second sub partition wall may include a first layer adjacent to the first sub partition wall, and including a first base resin, and a second layer disposed on the first layer, and including the first base resin and the liquid repellent.

In an embodiment, the first sub partition wall may have a height of about 5 μm to about 15 μm in a thickness direction of the display panel, and the second sub partition wall may have a height of about 0.5 μm to about 5 μm in the thickness direction of the display panel.

In an embodiment, the scattering body may have a weight of about 5 wt. % to about 30 wt % with respect to a total weight of the first sub partition wall.

In an embodiment, the first sub partition wall may further include a pigment.

In an embodiment, the pigment may have a weight of about 0.5 wt % to about 5 wt % with respect to the total weight of the first sub partition wall.

In an embodiment, the first sub partition wall may further include a second base resin in which the scattering body and the pigment are dispersed.

In an embodiment, the second sub partition wall may not include the scattering body and the pigment.

In an embodiment, the second sub partition wall may have a light transmittance of about 15% or more for light in a wavelength range of about 750 nm to about 900 nm.

In an embodiment, the liquid repellent may include fluorine.

In an embodiment, the display panel may include a light-emitting element configured to emit first color light, and the color control part may include a first color control part including first quantum dots which convert the first color light to second color light having a longer wavelength range than the first color light, a second color control part including second quantum dots which convert the first color light to third color light having a longer wavelength range than the first color light and the second color light, and a third color control part which transmits the first color light.

In an embodiment, the color conversion member may further include a color filter layer disposed on the color control part, and the color filter layer may include a first color filter part which transmits the second color light, a second color filter part which transmits the third color light, a third color filter part which transmits the first color light, and a light-blocking part disposed between the first to third color filter parts.

In an embodiment of the invention, a display device includes a display panel, and a color conversion member disposed on the display panel, where the color conversion member includes a plurality of partition walls disposed on the display panel, and spaced apart from each other, and each of the plurality of partition walls include a first sub partition wall including a scattering body and a pigment, and a second sub partition wall disposed on the first sub partition wall, including a liquid repellent, and not including the scattering body and the pigment.

In an embodiment of the invention, a manufacturing method of a display device includes preparing a substrate, and providing a plurality of partition walls on the substrate, where the providing the plurality of partition walls includes providing a coating layer including a scattering body, forming a preliminary first sub partition wall by exposing and developing the coating layer, providing, on the preliminary first sub partition wall, a preliminary second sub partition wall including a liquid repellent, and exposing and developing the preliminary first sub partition wall and the preliminary second sub partition wall, and the preliminary second sub partition wall has a higher light transmittance than the preliminary first sub partition wall.

In an embodiment, the preparing the substrate may include providing an align key on the substrate, and the providing the coating layer may include forming the coating layer to cover the align key.

In an embodiment, the forming the preliminary first sub partition wall may include exposing the align key by exposing and developing the coating layer.

In an embodiment, the providing the preliminary second sub partition wall may include providing the preliminary second sub partition wall to cover the align key.

In an embodiment, the manufacturing method may further include aligning mask patterns on the substrate using the align key, before the exposing and developing the preliminary first sub partition wall and the preliminary second sub partition wall.

In an embodiment, the preliminary second sub partition wall may have a light transmittance of about 15% or more for light in a wavelength range of about 750 nm to about 900 nm.

In an embodiment, in the exposing and developing the preliminary first sub partition wall and the preliminary second sub partition wall, the liquid repellent may be phase-separated onto the preliminary second sub partition wall.

BRIEF DESCRIPTION OF THE DRAWINGS

The accompanying drawings are included to provide a further understanding of embodiments of the invention, and are incorporated in and constitute a part of this specification. The drawings illustrate embodiments of the invention and, together with the description, serve to explain principles of the invention. In the drawings:

FIG. 2B is a cross-sectional view of a display device according to an embodiment of the invention;

DETAILED DESCRIPTION

Figure 1A:
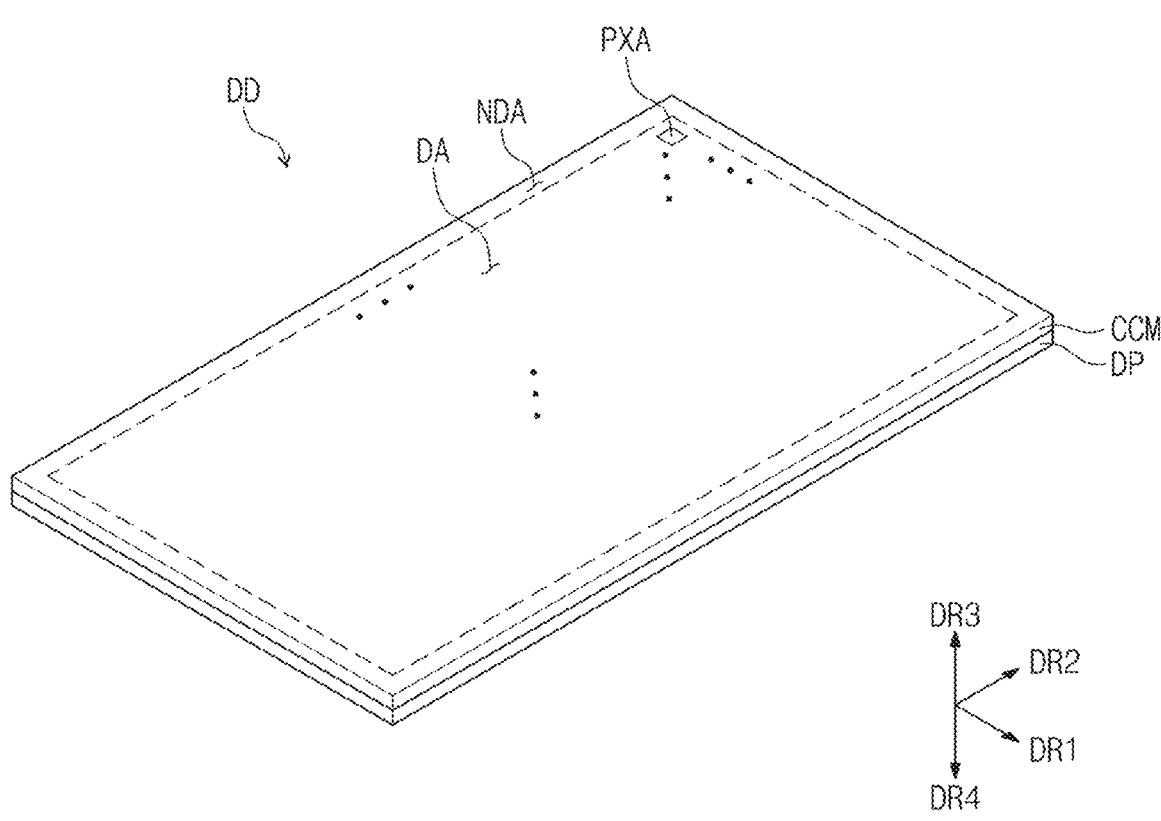
FIG. 1A is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, when a component (or region, layer, portion, etc.) is referred to as "on", "connected", or "coupled" to another component, it means that it is placed/ connected/coupled directly on the other component or a third component can be disposed between them.

The same reference numerals or symbols refer to the same elements. In addition, in the drawings, thicknesses, ratios, and dimensions of components are exaggerated for effective description of technical content.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In addition, terms such as "below", "lower", "above", and "upper" are used to describe the relationship between components shown in the drawings. The terms are relative concepts and are described based on the directions indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the application, "directly disposed" may mean that there is no layer, film, region, plate, etc. added between a portion such as a layer, film, region, or plate and another portion. For example, "direct disposed" may mean placing two layers or two members without using an additional member such as an adhesive member therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used in this specification have the same meaning as commonly understood by one of ordinary skill in the art to which this invention belongs. In addition, terms such as terms defined in commonly used dictionaries should be interpreted as having a meaning consistent with the meaning having in the context of the related technology, and should not be interpreted as too ideal or too formal unless explicitly defined here.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display device and a manufacturing method of the display device according to the invention will be described with reference to the accompanying drawings.

Figure 1B:
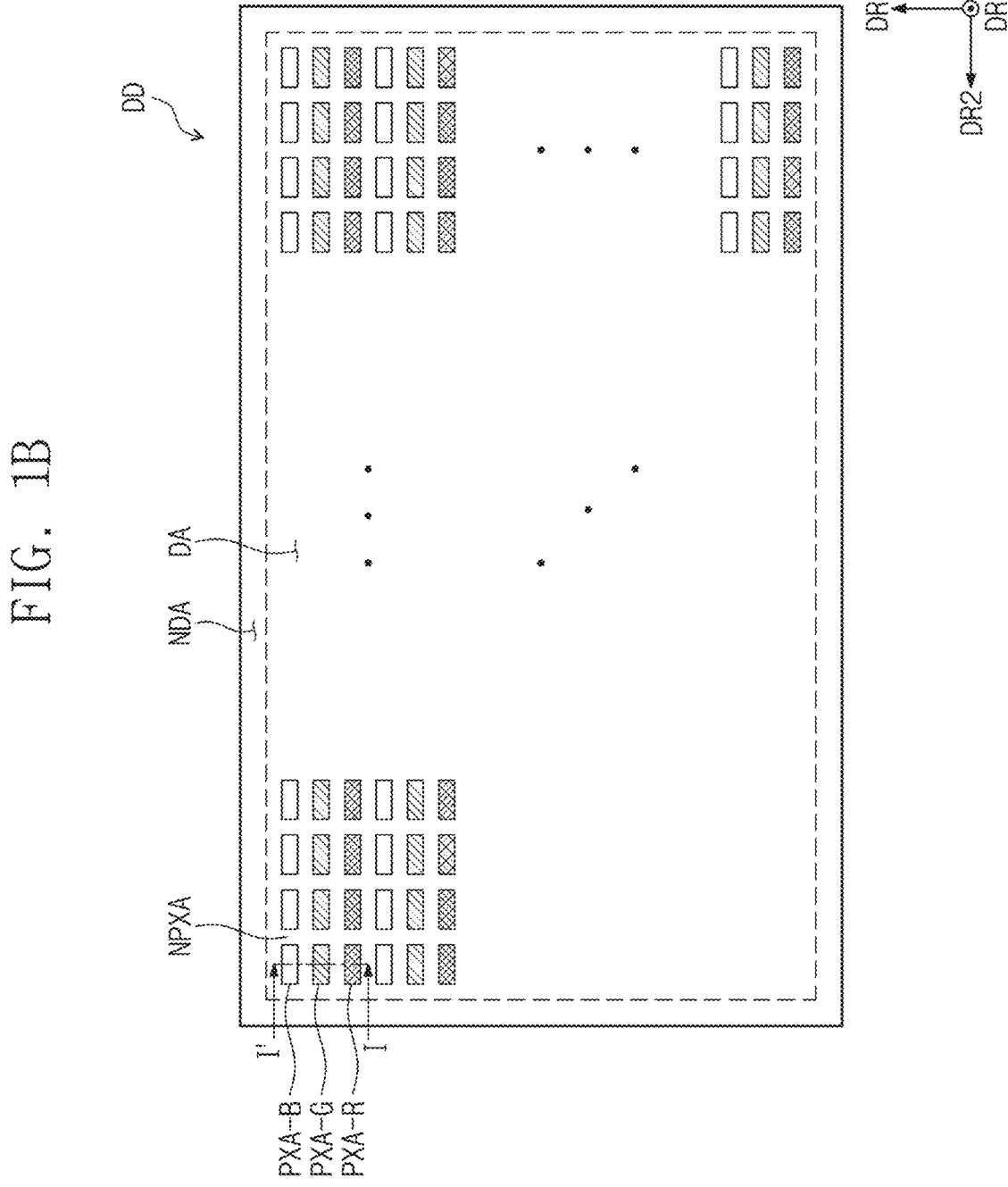
FIG. 1B is a plan view of a display device according to an embodiment of the invention.

FIG. 1A is a perspective view of a display device according to an embodiment. FIG. 1B is a plan view of a display device according to an embodiment.

The display device DD according to an embodiment may be a device activated in response to an electric signal. In an embodiment, for example, the display device DD may be a mobile phone, a tablet computer, a car navigation, a game console, or a wearable device, but an embodiment of the invention is not limited thereto.

In FIG. 1A and the following drawings, a first direction DR1 to a fourth direction DR4 are illustrated, and directions indicated by the first to the fourth directions DR1, DR2, DR3, and DR4 described herein are relative concepts, and may be changed to other directions.

In the disclosure, the thickness direction of the display device DD may be a direction parallel to a third direction DR3 which is a normal direction to the plane defined by a first direction DR1 and a second direction DR2. In the disclosure, the front surface (or upper surface) and the rear surface (or lower surface) of each member constituting the display device DD may be defined on the basis of the third direction DR3.

Referring to FIG. 1A and FIG. 1B, the display device DD according to an embodiment may include a display region DA and a non-display region NDA adjacent to the display region DA. The display region DA corresponds to a part on which an image is displayed. A plurality of pixel regions PXA and a peripheral region NPXA may be defined in the display region DA. The plurality of pixel regions PXA may include first to third pixel regions PXA-R, PXA-G, and PXA-B that emit light in different wavelength ranges from each other. The peripheral region NPXA sets the boundaries of the first to third pixel regions PXA-R, PXA-G, and PXA-B. A structure which prevents color mixing between the first to third pixel regions PXA-R, PXA-G, and PXA-B, for example, a partition wall BK (see FIG. 3A) or the like, may be disposed in the peripheral region NPXA.

In the display device DD according to an embodiment, the plurality of pixel regions PXA may include three pixel regions PXA-R, PXA-G, and PXA-B that respectively emit red color light, green color light, and blue color light. In an embodiment, for example, the display device DD may include a first pixel region PXA-R, a second pixel region PXA-G, and a third pixel region PXA-B which are distinguished from each other.

The pixel regions PXA-R, PXA-G, and PXA-B in the display device DD according to an embodiment may be arranged in the form of a stripe. Referring to FIG. 1B, in an embodiment, a plurality of first pixel regions PXA-R, a plurality of second pixel regions PXA-G, and a plurality of third pixel regions PXA-B may be each aligned along the second direction DR2. In such an embodiment, the first pixel region PXA-R, the second pixel region PXA-G, and the third pixel region PXA-B may be sequentially and repeatedly disposed along the first direction DR1.

FIG. 1B illustrates that the areas of the pixel regions PXA-R, PXA-G, and PXA-B are all similar, but an embodiment of the invention is not limited thereto. The areas of the pixel regions PXA-R, PXA-G, and PXA-B may be different from each other depending on the wavelength range of emitted light. Here, the areas of the pixel regions PXA-R, PXA-G, and PXA-B may mean areas as seen on a plane defined by the first direction DR1 and the second direction DR2 or in a plan view in the third direction DR3. In an embodiment, the areas of the pixel regions PXA-R, PXA-G, and PXA-B may be different from each other. For example, in an embodiment, the area of the second pixel region PXA-G may be smaller than the area of the third pixel region PXA-B, but an embodiment of the invention is not limited thereto.

In embodiments, the arrangement form of the pixel regions PXA-R, PXA-G, and PXA-B is not limited to what is illustrated in FIG. 1B, and the sequence in which the first pixel region PXA-R, the second pixel region PXA-G, and the third pixel region PXA-B are arranged may be provided in various combinations depending on the characteristics of display quality set in the display device DD. In an embodiment, for example, the arrangement form of the pixel regions PXA-R, PXA-G, and PXA-B may be a pentile (PENTILE) arrangement form, or a diamond arrangement form.

Referring to FIGS. 1A and 1B together, in an embodiment, the display region DA may be a quadrilateral shape. The non-display region NDA may surround the display region DA. However, an embodiment of the invention is not limited thereto, and the shape of the display region DA and the shape of the non-display region NDA may be relatively designed. Alternatively, the non-display region NDA may be omitted.

Figure 3A:
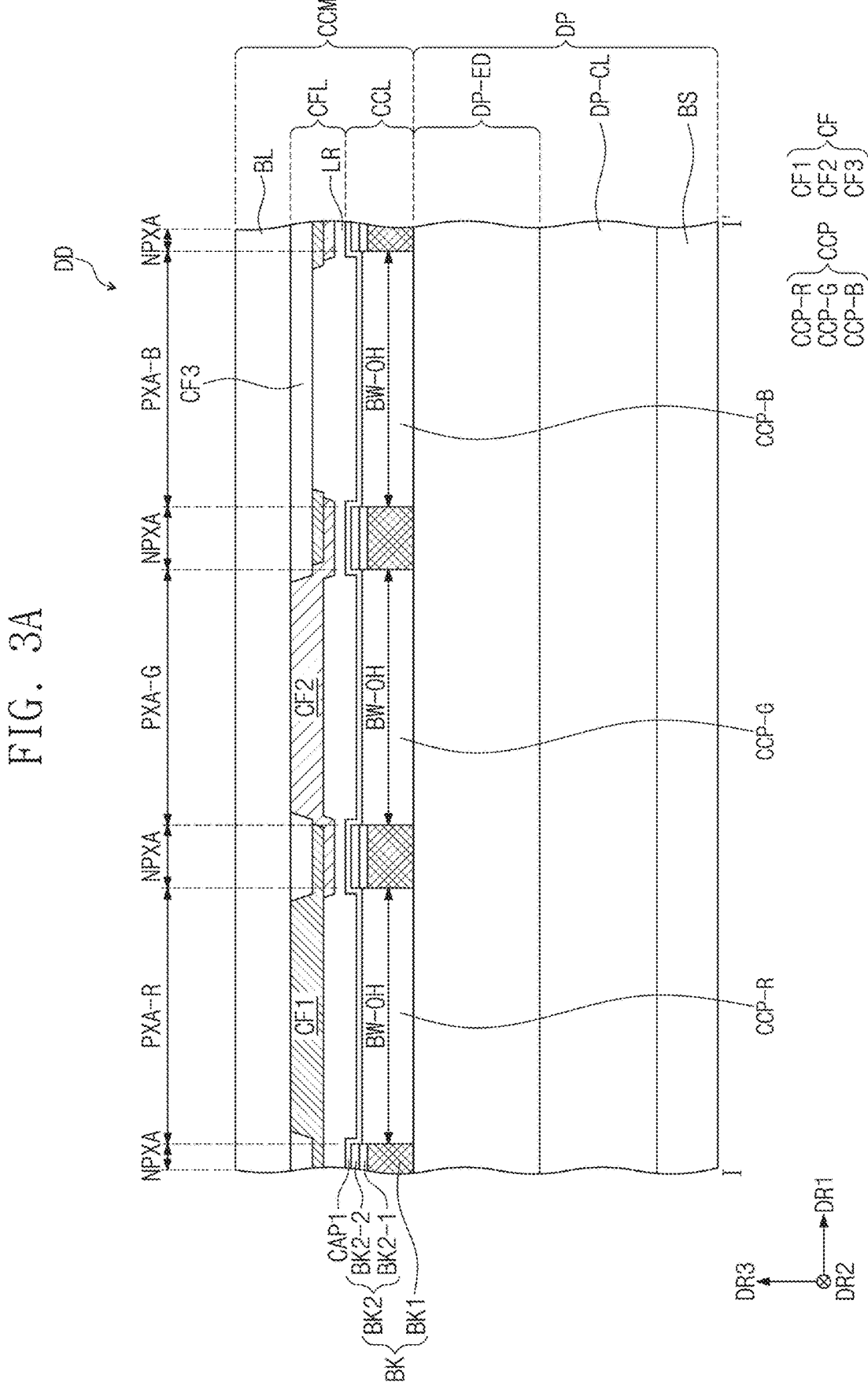
FIG. 3A is a cross-sectional view of a display device according to an embodiment of the invention.

The display device DD according to an embodiment includes a display panel DP including a display element layer DP-ED (see FIG. 3A) and a color conversion member CCM including a light control layer CCL (see FIG. 3A).

The display panel DP may be an ultrasmall light-emitting element display panel DP including an ultrasmall light-emitting element. In an embodiment, for example, the display panel DP may include a light-emitting element, and the light-emitting element may be a nano light emitting diode (LED) or a micro LED. However, an embodiment of the invention is not limited thereto, and the display panel DP included in the display device DD according to an embodiment may also be an organic electroluminescence display panel, or a quantum dot light-emitting display panel.

Figure 2A:
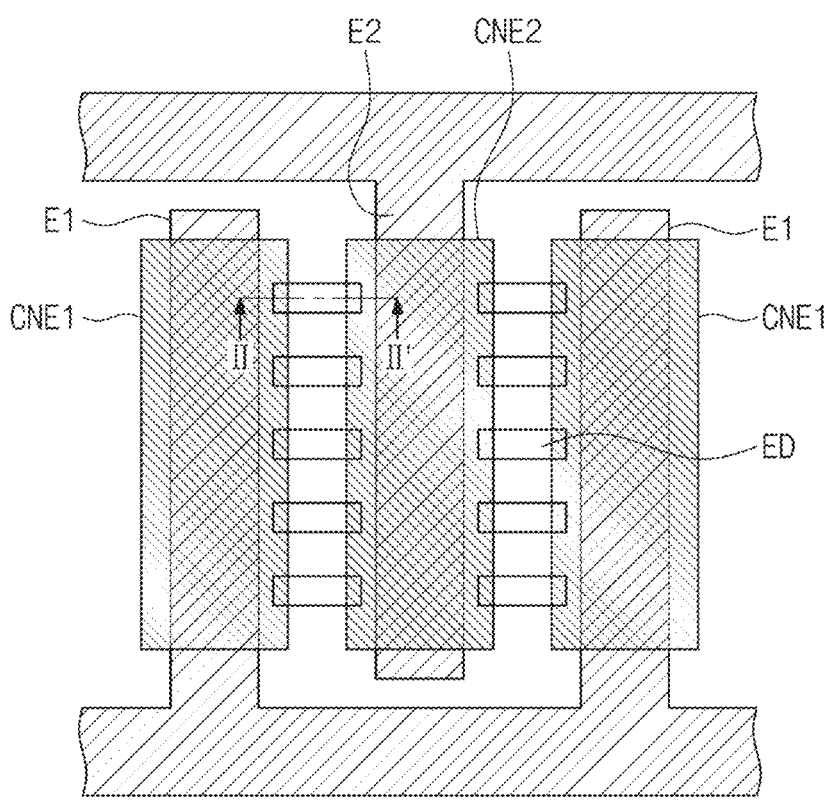
FIG. 2A is a plan view of a display device according to an embodiment of the invention.
Figure 2A:
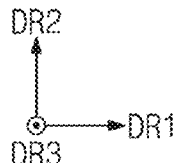
Figure 2B:
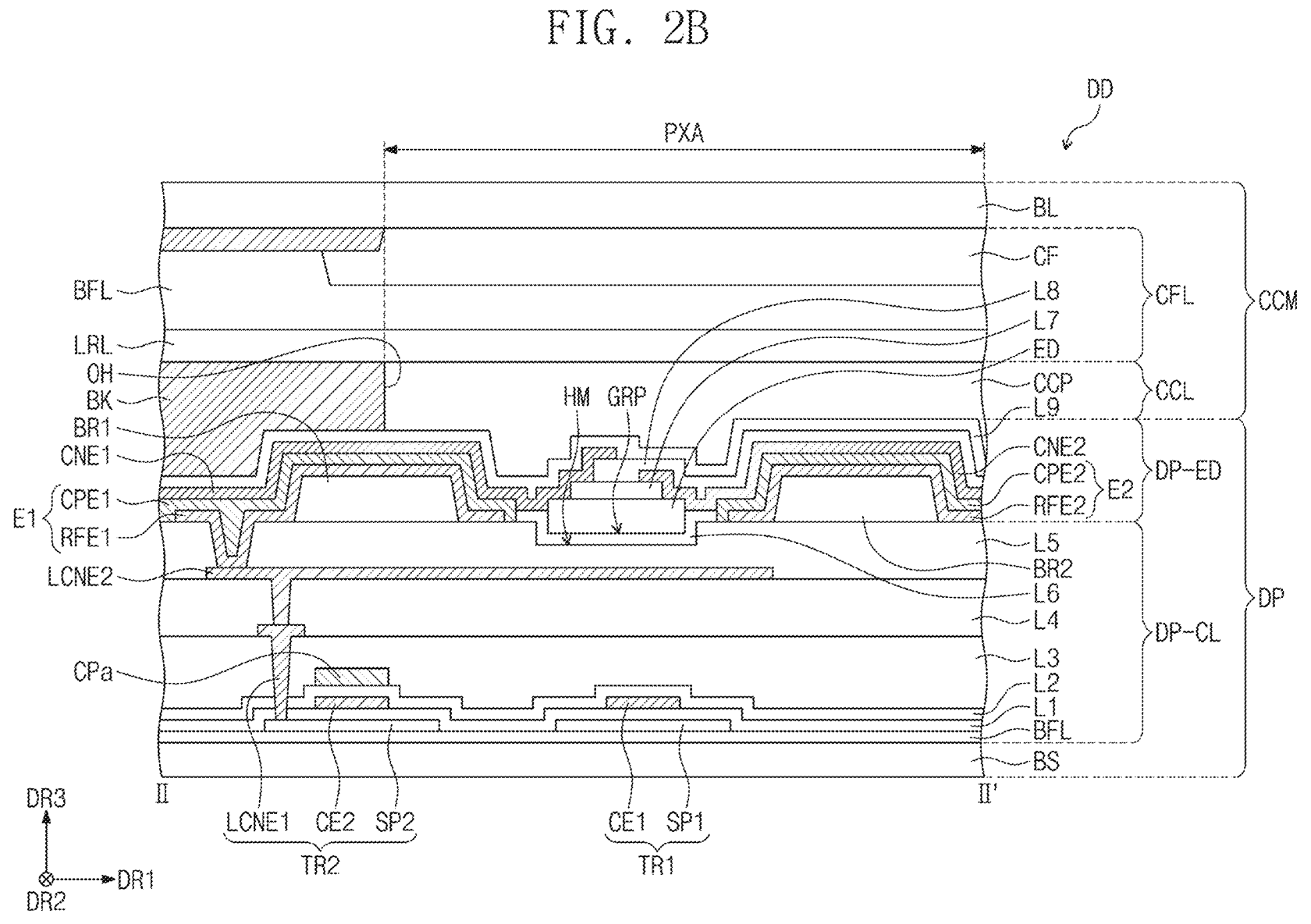

FIG. 2A is a plan view of a part of a display device according to an embodiment. FIG. 2B is a cross-sectional view of a display device according to an embodiment. For easy description, FIG. 2B illustrates a part including a pixel region PXA corresponding to one pixel, and some components are omitted. FIG. 2B may illustrate a cross-section of a part taken along line II-II' in FIG. 2A.

Referring to FIGS. 2A and 2B, a display device DD according to an embodiment may include a display panel DP and a color conversion member CCM disposed on the display panel DP. The display panel DP may include a base substrate BS, a circuit layer DP-CL disposed on the base substrate BS, and a display element layer DP-ED disposed on the circuit layer DP-CL.

In the display panel DP, the base substrate BS may be a member that provides a base surface on which the circuit layer DP-CL and the display element layer DP-ED are disposed. The base substrate BS may be a stack structure including a plastic substrate, an insulating film, or a plurality of insulating layers. The base substrate BS may have a multi-layered structure. In an embodiment, for example, the base substrate BS may have a three-layered structure of a polymer resin layer, a barrier layer, and a polymer resin layer. In such an embodiment, the polymer resin layer may include a polyimide-based resin. In an embodiment, the base substrate BS may be a single-layered support layer including or formed of polyimide.

The circuit layer DP-CL may be disposed on the base substrate BS. The circuit layer DP-CL may include an insulating layer, a semiconductor pattern, a conductive pattern, a signal line, etc. In an embodiment, an insulating layer, a semiconductor layer, and a conductive layer may be formed on the base substrate BS through coating, deposition, etc., and may be selectively patterned by performing a photolithography process multiple times. Thereafter, a semiconductor pattern, a conductive pattern, and a signal line included in the circuit layer DP-CL may be formed.

The circuit layer DP-CL may include a thin film transistor disposed on the base substrate BS, and a plurality of insulating layers. In addition, the circuit layer DP-CL may include a plurality of connection electrodes disposed through or formed to penetrate the plurality of insulating layers.

In the circuit layer DP-CL, a buffer layer BFL may be disposed on the base substrate BS. A first thin film transistor TR1 and a second thin film transistor TR2 may be disposed on the buffer layer BFL. The first thin film transistor TR1 may include a first control electrode CE1 and a first semiconductor pattern SP1. The second thin film transistor TR2 may include a second control electrode CE2, a first lower connection electrode LCNE1, and a second semiconductor pattern SP2.

The first semiconductor pattern SP1 and the second semiconductor pattern SP2 may be disposed on the buffer layer BFL. In an embodiment, the buffer layer BFL may provide the first semiconductor pattern SP1 and the second semiconductor pattern SP2 with modified surfaces. In such an embodiment, the first semiconductor pattern SP1 and the second semiconductor pattern SP2 may have a higher adhesion to the buffer layer BFL than in a case where the first semiconductor pattern SP1 and the second semiconductor pattern SP2 are directly formed on the base substrate BS. Alternatively, the buffer layer BFL may be a barrier layer that protects the lower surface of each of the first semiconductor pattern SP1 and the second semiconductor pattern SP2. In such an embodiment, the buffer layer BFL may prevent pollutant or humidity introduced from the base substrate BS itself, or introduced through the base substrate BS from infiltrating into the first semiconductor pattern SP1 and the second semiconductor pattern SP2.

In the circuit layer DP-CL, a first insulating layer L1 may be disposed on the buffer layer BFL, and may cover the first semiconductor pattern SP1 and the second semiconductor pattern SP2. The first insulating layer L1 may include an inorganic material, and may have a single- or multi-layered structure. The first insulating layer L1 may include at least one selected from aluminum oxide, titanium oxide, silicon oxide, silicon nitride, silicon oxynitride, zirconium oxide and hafnium oxide. The first control electrode CE1 and the second control electrode CE2 may be disposed on the first insulating layer L1. A second insulating layer L2 may be disposed on the first insulating layer L1, and may cover the first control electrode CE1 and the second control electrode CE2. The second insulating layer L2 may include an inorganic material.

In the circuit layer DP-CL, a capacitor (not shown) may include a first cap electrode (not shown) and a second cap electrode CPa. In an embodiment, for example, the first cap electrode (not shown) may be branched from (or defined by a part branching from) the second control electrode CE2, and the second cap electrode CPa may be disposed on the second insulating layer L2.

In the circuit layer DP-CL, a third insulating layer L3 may be disposed on the second insulating layer L2, and may cover the second cap electrode CPa. The first lower connection electrode LCNE1 connected to the second semiconductor pattern SP2 may be disposed on the third insulating layer L3. Meanwhile, the first thin film transistor TR1 and the second thin film transistor TR2 may be each disposed on the third insulating layer L3, and may further include input electrodes and output electrodes respectively connected to the first semiconductor pattern SP1 and the second semiconductor pattern SP2 through through-holes penetrating first to third insulating layers L1, L2, and L3. At least a part of each of signal lines, for example, scan lines or data lines may be disposed on the third insulating layer L3.

In the circuit layer DP-CL, a fourth insulating layer L4 may be disposed on the third insulating layer L3, and may cover the first lower connection electrode LCNE1. The fourth insulating layer L4 may include an inorganic material and/or an organic material, and may have a single- or multi-layered structure. A second lower connection electrode LCNE2 may be disposed on the fourth insulating layer L4. Not only the second lower connection electrode LCNE2 but also at least another part of each of signal lines, for example, scan lines or data lines may be disposed on the fourth insulating layer L4. The second lower connection electrode LCNE2 may be connected to the first lower connection electrode LCNE1.

In the circuit layer DP-CL, a fifth insulating layer L5 may be disposed on the fourth insulating layer L4, and may cover the second lower connection electrode LCNE2. The fifth insulating layer L5 may include an organic material. The fifth insulating layer L5 may cover a pixel circuit (not shown) disposed thereunder, and may provide a flat surface to at least a part thereof. For example, the fifth insulating layer L5 may provide a flat surface to a region except a region in which a groove HM is defined. However, this is only an example, and the groove HM may not be defined in the fifth insulating layer L5.

In the display element layer DP-ED, a first partition wall BR1 and a second partition wall BR2 may be disposed on the fifth insulating layer L5. The first partition wall BR1 and the second partition wall BR2 may be spaced apart from each other in the first direction DR1. The first partition wall BR1 and the second partition wall BR2 may each include an organic material.

In the display element layer DP-ED, a first electrode E1 may cover the first partition wall BR1, and a second electrode E2 may cover the second partition wall BR2. That is, the first partition wall BR1 may be disposed between the first electrode E1 and the fifth insulating layer L5, and the second partition wall BR2 may be disposed between the second electrode E2 and the fifth insulating layer L5.

A through-hole may be defined or provided in the fifth insulating layer L5, and the second lower connection electrode LCNE2 may be exposed by the through-hole. The first electrode E1 may be electrically connected to the exposed second lower connection electrode LCNE2. Although not shown, the second electrode E2 may be electrically connected to a second power line (not shown). That is, a second power supply voltage (not shown) may be provided to the second electrode E2.

The first electrode E1 may include a first reflection electrode RFE1 and a first capping electrode CPE1, and the second electrode E2 may include a second reflection electrode RFE2 and a second capping electrode CPE2.

The first reflection electrode RFE1 and the second reflection electrode RFE2 may each include a reflective material. The first reflection electrode RFE1 and the second reflection electrode RFE2 may each have a single-layered structure, or a stack structure in which a plurality of layers are stacked. In an embodiment, for example, the first reflection electrode RFE1 and the second reflection electrode RFE2 may each have a structure in which indium-tin oxide (ITO), silver (Ag), and indium-tin oxide (ITO) are sequentially stacked.

The first capping electrode CPE1 may cap the first reflection electrode RFE1, and the second capping electrode CPE2 may cap the second reflection electrode RFE2. For example, the first capping electrode CPE1 and the second capping electrode CPE2 may each include at least one selected from indium-zinc oxide (IZO), indium-tin oxide (ITO), indium-gallium oxide (IGO), indium-gallium-zinc oxide (IGZO), and a mixture/compound thereof.

On a plane or in a plan view, the groove HM may be defined or provided in one region of the fifth insulating layer L5 between the first electrode E1 and the second electrode E2. When viewed in the third direction DR3, the groove HM may not overlap the first electrode E1 and the second electrode E2.

In the display element layer DP-ED, a sixth insulating layer L6 may be disposed on the groove HM. The sixth insulating layer L6 may include an inorganic material. A bent portion GRP may be defined or provided in a region corresponding to the groove HM in the sixth insulating layer L6. In an embodiment, for example, the groove HM and the bent portion GRP may overlap each other on a plane. In an alternative embodiment of the invention, the groove HM may not be provided. In such an embodiment, the bent portion GRP may not be defined or provided in the sixth insulating layer L6.

In the display element layer DP-ED, a light-emitting element ED may be disposed on the sixth insulating layer L6. The light-emitting element ED may be disposed between the first electrode E1 and the second electrode E2. The light-emitting element ED may be electrically connected to the first electrode E1 and the second electrode E2. The light-emitting element ED may be disposed between the first partition wall BR1 and the second partition wall BR2. In an embodiment, for example, the light-emitting element ED may be disposed in the groove HM and the bent portion GRP.

The light-emitting element ED may include an n-type semiconductor layer, a p-type semiconductor layer, and an activation layer disposed between the n-type semiconductor layer and the p-type semiconductor layer. The light-emitting element ED may have various shapes such as a cylindrical shape or a polygonal column shape. In the light-emitting element ED, the n-type semiconductor layer may be connected to one of the first electrode E1 and the second electrode E2, and the p-type semiconductor layer may be connected to the other of the first electrode E1 and the second electrode E2. The activation layer may have or be formed of at least one selected from a single quantum well structure, a multiple quantum well structure, a quantum ray structure, and a quantum dot structure. The activation layer may be a region in which electrons injected through the n-type semiconductor layer and holes injected through the p-type semiconductor layer are recombined.

Referring to FIG. 2A, in the display device DD according to an embodiment, the first electrode E1 and the second electrode E2 may each extend along the second direction DR2, and may be spaced apart from each other in the first direction DR1. FIG. 2A illustrates only an example, and the invention is not limited thereto. The first electrode E1 and the second electrode E2 may have various modified structures without limitation, as long as having a structure in which the first electrode E1 and the second electrode E2 are spaced apart from each other. FIG. 2A exemplarily illustrates an embodiment having a structure in which two first electrodes E1 are provided while the second electrode E2 extending in the second direction DR2 is disposed therebetween.

On a plane, the light-emitting element ED may be disposed between the first electrode E1 and the second electrode E2, and may not overlap the first electrode E1 and the second electrode E2. The light-emitting element ED may be provided in plurality, and the plurality of light-emitting elements ED may be connected to each other in parallel. The light-emitting element ED may be electrically connected to the first electrode E1 by a first connection electrode CNE1, and to the second electrode E2 by a second connection electrode CNE2.

Referring to FIG. 2B again, in the display element layer DP-ED, a seventh insulating layer L7 (or insulating pattern) may be disposed on the light-emitting element ED. The seventh insulating layer L7 may cover at least a part of the upper surface of the light-emitting element ED.

The second connection electrode CNE2 may be disposed on the seventh insulating layer L7, the light-emitting element ED, the sixth insulating layer L6, and the second electrode E2. In the display element layer DP-ED, an eighth insulating layer L8 may be disposed on the second connection electrode CNE2 and the seventh insulating layer L7. The first connection electrode CNE1 may be disposed on the eighth insulating layer L8, the seventh insulating layer L7, the light-emitting element ED, the sixth insulating layer L6, and the first electrode E1. Even in an embodiment where the light-emitting element ED has a length of several hundred micrometers or less, the first connection electrode CNE1 and the second connection electrode CNE2 may not be in direct contact with each other due to the eighth insulating layer L8. However, this is only one embodiment of the invention, and in alternative embodiment of the invention, the first connection electrode CNE1 and the second connection electrode CNE2 may be simultaneously formed through a same process.

The first connection electrode CNE1 and the second connection electrode CNE2 may each include a conductive material. In an embodiment, for example, the conductive material may include at least one selected from indium-zinc oxide (IZO), indium-tin oxide (ITO), indium-gallium oxide (IGO), indium-gallium-zin oxide (IGZO), and a mixture/compound thereof. However, the invention is not limited thereto. In an alternative embodiment, for example, the conductive material may be a metal material, and the metal material may include, for example, molybdenum, silver, titanium, copper, aluminum, or an alloy thereof.

In the display element layer DP-ED, a ninth insulating layer L9 may be disposed on the first connection electrode CNE1 and the eighth insulating layer L8. The ninth insulating layer L9 may be an encapsulation layer that blocks moisture and oxygen by encapsulating the light-emitting element ED.

The color conversion member CCM may include a base layer BL and a light control layer CCL. The light control layer CCL may include a photoconverter. The photoconverter may be a quantum dot, a phosphor, or the like. The photoconverter may wavelength-convert received light and emit the wavelength-converted light. That is, the light control layer CCL may be a layer including a quantum dot or a layer including a phosphor.

The light control layer CCL may include a plurality of color control parts CCP. In addition, the light control layer CCL may include color control parts CCP spaced apart from each other, and partition walls BK disposed between the color control parts CCP spaced apart from each other. The plurality of color control parts CCP may be disposed on the display element layer DP-ED. The plurality of color control parts CCP may be directly disposed on the display element layer DP-ED. The plurality of color control parts CCP may be directly disposed on the ninth insulating layer L9 of the display element layer DP-ED.

The color conversion member CCM according to an embodiment may further include a color filter layer CFL. The color filter layer CFL may be disposed between the base layer BL and the light control layer CCL. The color filter layer CFL may include a filter part CF. The filter part CF may be disposed on one surface of the base layer BL facing the base substrate BS.

According to an embodiment, the color conversion member CCM may include the base layer BL disposed on the color filter layer CFL. The base layer BL may be a member that provides a base surface on which the light control layer CCL, etc., are disposed. The base layer BL may be a glass substrate, a metal substrate, a plastic substrate, or the like. However, an embodiment of the invention is not limited thereto, and the base layer BL may be an inorganic layer, an organic layer, or a composite material layer. In an alternative embodiment, the base layer BL may be omitted.

Figure 3B:
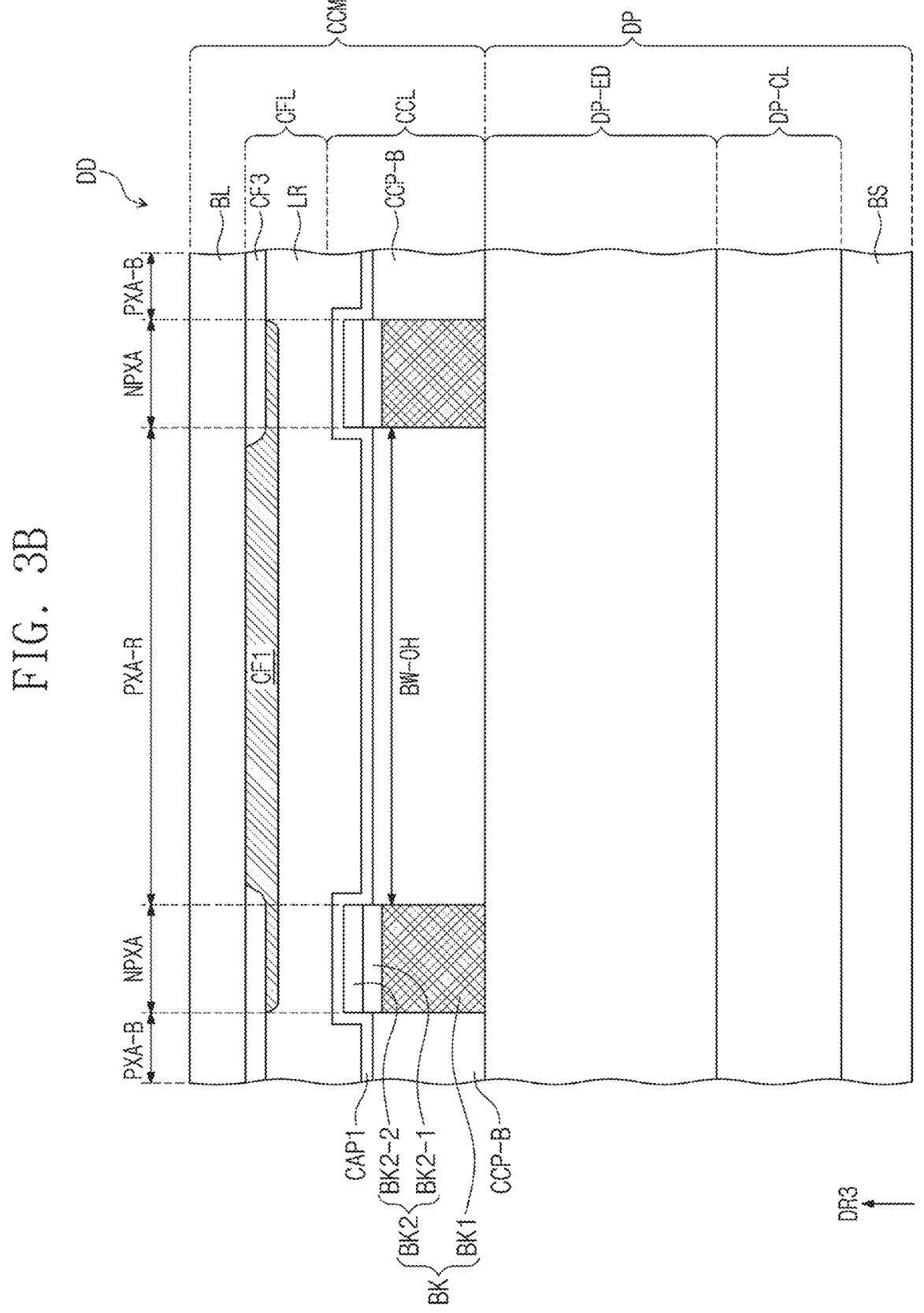
FIG. 3B is an enlarged cross-sectional view illustrating a part of a display device according to an embodiment of the invention.
Figure 3C:
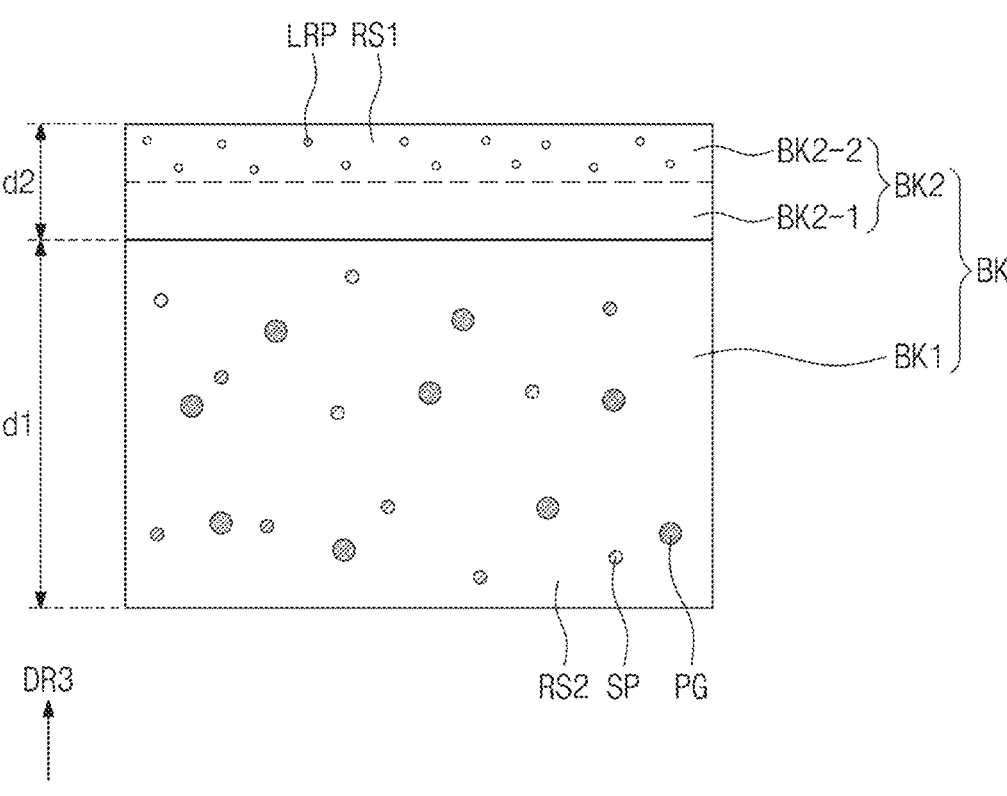
FIG. 3C is a cross-sectional view of a partition wall according to an embodiment of the invention.
Figure 3D:
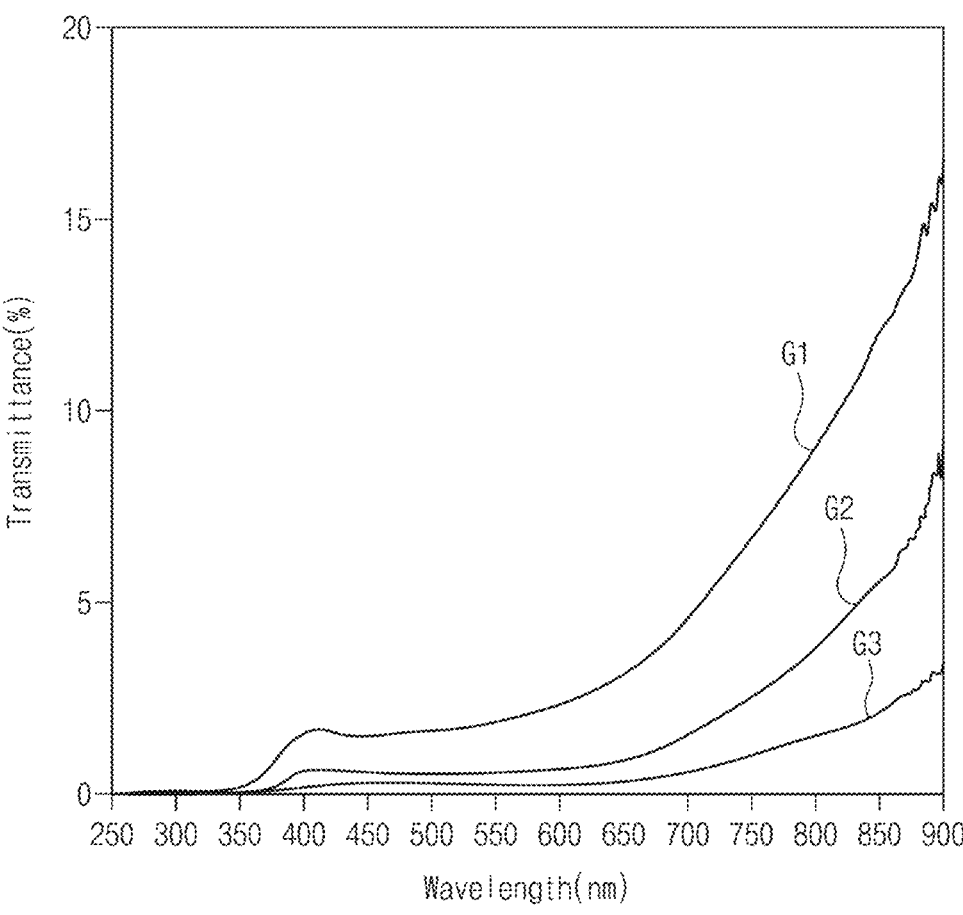
FIG. 3D is a graph showing a transmittance versus a wavelength of a first sub partition wall according to an embodiment of the invention.

FIG. 3A is a cross-sectional view of a display device according to an embodiment of the invention. FIG. 3B is an enlarged cross-sectional view illustrating a part of a display device according to an embodiment of the invention. FIG. 3C is a cross-sectional view illustrating a partition wall according to an embodiment. FIG. 3D is a graph showing a light transmittance versus a wavelength of a first sub partition wall BK1. FIG. 3A illustrates a cross-sectional view of a part taken along line I-I' in FIG. 1B.

Referring to FIG. 3A, a display device DD according to an embodiment may include a display panel DP and a color conversion member CCM disposed on the display panel DP, and the color conversion member CCM may include a light control layer CCL and a color filter layer CFL. The color conversion member CCM may include a base layer BL, the light control layer CCL disposed under the base layer BL, and the color filter layer CFL disposed between the light control layer CCL and the base layer BL. In the color conversion member CCM, the light control layer CCL may be disposed adjacent to the display panel DP.

The display device DD may include a peripheral region NPXA and pixel regions PXA-R, PXA-G, and PXA-B. The pixel regions PXA-R, PXA-G, and PXA-B may be each a region in which light generated from a light-emitting element ED (see FIG. 2B) included in the display element layer DP-ED is emitted. The areas of the respective pixel regions PXA-R, PXA-G, and PXA-B may be different from each other, and the area may mean an area as seen on a plane or in a plan view in the third direction DR3. In such an embodiment, the configurations of the display element layer DP-ED is substantially the same as those described above with reference to FIG. 2B, and any repetitive detailed description thereof will be omitted.

The pixel regions PXA-R, PXA-G, and PXA-B may be divided into a plurality of groups depending on the color of emitted light. Three pixel regions PXA-R, PXA-G, and PXA-B respectively emitting red color light, green color light, and blue color light are exemplarily illustrated in the display device DD according to an embodiment illustrated in FIG. 3A. For example, the display device DD according to an embodiment may include a first pixel region PXA-R, a second pixel region PXA-G, and a third pixel region PXA-B which are distinguished from each other.

In the display device DD according to an embodiment illustrated in FIG. 3A, the display panel DP may emit light having a same wavelength range regardless of the pixel regions PXA-R, PXA-G, and PXA-B of the display device DD. In an embodiment, for example, the display panel DP may provide blue light, which is first color light, to a color conversion member CCM.

In the display device DD according to an embodiment, as illustrated in FIG. 3A, the pixel regions PXA-R, PXA-G, and PXA-B each have a same area as each other, but an embodiment of the invention is not limited thereto. Alternatively, the pixel regions PXA-R, PXA-G, and PXA-B may be respectively provided to have various areas. In an embodiment, for example, among the pixel regions PXA-R, PXA-G, and PXA-B, the first pixel region PXA-R and the second pixel region PXA-G may have a same area as each other, and the third pixel region PXA-B may have a smaller area than the first pixel region PXA-R and the second pixel region PXA-G. However, an embodiment of the invention is not limited thereto, and the pixel regions PXA-R, PXA-G, and PXA-B may respectively have various areas depending on the color of light emitted from color control parts CCP-R, CCP-G, and CCP-B. For example, in the display device DD according to an embodiment, the third pixel region PXA-B may have the largest area, and the second pixel region PXA-G may have the smallest area. However, an embodiment of the invention is not limited thereto, and the pixel regions PXA-R, PXA-G, and PXA-B may emit other color light except red color light, green color light, and blue color light, or the pixel regions PXA-R, PXA-G, and PXA-B may be provided in a different area ratio.

The display panel DP according to an embodiment includes a base substrate BS, a circuit layer DP-CL disposed on the base substrate BS, and a display element layer DP-ED disposed on the circuit layer DP-CL. The elements in the display device DD according to an embodiment illustrated in FIG. 3A are substantially the same as those described above with reference to FIGS. 2A and 2B, and any repetitive detailed description thereof will be omitted.

The color conversion member CCM may include the light control layer CCL. The light control layer CCL is disposed on the display panel DP. The light control layer CCL may be directly disposed on the display panel DP. The light control layer CCL may be directly disposed on the display element layer DP-ED of the display panel DP. The light control layer CCL may be disposed on a same substrate as the display element layer DP-ED, for example, on the base substrate BS. Accordingly, the light control layer CCL and the display panel DP may be formed through a continuous process without a separate bonding process.

The light control layer CCL may include a plurality of partition walls BK disposed spaced apart from each other, and a plurality of color control parts CCP-R, CCP-G, and CCP-B disposed between the plurality of partition walls BK. The partition walls BK may define bank openings BW-OH that expose one surface of the color filter layer CFL disposed to overlap the light control layer CCL. The color control parts CCP-R, CCP-G, and CCP-B may fill the bank openings BW-OH.

Referring to FIG. 3B and FIG. 3C, the plurality of partition walls BK may each include a first sub partition wall BK1 and a second sub partition wall BK2. Since the light control layer CCL is directly disposed on the display panel DP, the first sub partition wall BK1 may be disposed adjacent to the display panel DP, and the second sub partition wall BK2 may be disposed on the first sub partition wall BK1. The second sub partition wall BK2 may be disposed spaced apart from the display panel DP with the first sub partition wall BK1 therebetween. That is, the plurality of partition walls BK may each include the first sub partition wall BK1 and the second sub partition wall BK2 which are sequentially stacked in the third direction DR3.

The first sub partition wall BK1 may include a scattering body SP. The scattering body SP may be an inorganic particle. In an embodiment, for example, the scattering body SP may include at least one selected from $TiO_2$, $ZnO$, $Al_2O_3$, $SiO_2$, and hollow silica.

The first sub partition wall BK1 may include the scattering body SP in a weight ratio of about 5 weight percent (wt %) to about 30 wt % with respect to the total weight of the first sub partition wall BK1. That is, the scattering body SP may be included in a weight ratio of about 5 wt % to about 30 wt % with respect to the total weight of the solid content of the resin composition which forms the first sub partition wall BK1. If the content of the scattering body SP included in the first sub partition wall BK1 is less than about 5 wt %, improvement in light-emitting efficiency by the partition wall BK may not be sufficiently achieved; and if the content of the scattering body SP included in the first sub partition wall BK1 is more than about 30 wt %, the durability and chemical resistance of the partition wall BK may be deteriorated due to the excessive content of the scattering body SP, and the amount of light scattered from the partition wall BK of the light control layer CCL may increase, thereby deteriorating the display quality of the display device DD.

The first sub partition wall BK1 may further include a pigment PG. The first sub partition wall BK1 may be formed to include the pigment PG. In an embodiment, for example, the first sub partition wall BK1 may include the pigment PG, and thus be formed as a black partition wall. In an embodiment, the pigment PG may include a black pigment such as carbon black, or a color pigment. In an embodiment where a color pigment is used, the first sub partition wall BK1 may be used to achieve a black color by properly mixing a plurality of color pigments. The color pigments may include a red color pigment, a green color pigment, a blue color pigment, a violet color pigment, a yellow color pigment, or the like, and the first sub partition wall BK1 may include at least two selected from color pigments listed above.

In an embodiment, the content of the pigment PG may be about 0.5 wt % to about 5 wt % with respect to the total weight of the first sub partition wall BK1. In such an embodiment where the content of the pigment PG satisfies the aforementioned range, the first sub partition wall BK1 may have sufficient light-blocking characteristics, and the dispersion stability of the pigment PG in the first sub partition wall BK1 may be ensured.

The first sub partition wall BK1 may further include a second base resin RS2 in which the scattering body SP and the pigment PG are dispersed. The second base resin RS2 may include or be composed of various resin compositions which may be generally referred to as a binder. In an embodiment, for example, the second base resin RS2 may be an acryl-based resin, a urethane-based resin, a silicon-based resin, an epoxy-based resin, or the like. The base resin may be a transparent resin.

The second sub partition wall BK2 may be disposed on the first sub partition wall BK1. The second sub partition wall BK2 may be disposed on the first sub partition wall BK1, and serve to facilitate recognition of an align key AK (see FIG. 6A) in an exposing process to be described later, while improving the durability and chemical resistance of the entire partition wall BK. In an embodiment, the second sub partition wall BK2 may be directly disposed on the first sub partition wall BK1. The second sub partition wall BK2 may include a first layer BK2-1 adjacent to the first sub partition wall BK1, and a second layer BK2-2 disposed on the first layer BK2-1. The first layer BK2-1 of the second sub partition wall BK2 may be directly disposed on the first sub partition wall BK1, and the second layer BK2-2 may be disposed spaced apart from the first sub partition wall BK1 with the first layer BK2-1 therebetween.

A liquid repellent LRP may be included in the second sub partition wall BK2. More specifically, the liquid repellent LRP may be included in the second layer BK2-2 of the second sub partition wall BK2. In the second sub partition wall BK2, the first layer BK2-1 may include a first base resin RS1, and the second layer BK2-2 may include the first base resin RS1, and the liquid repellent LRP dispersed in the first base resin RS1. In an embodiment, for example, in the second sub partition wall BK2, the first layer BK2-1 may be formed to include the first base resin RS1, and the second layer BK2-2 may be formed to include the first base resin RS1 and the liquid repellent LRP. The liquid repellent LRP may be mainly included in the second layer BK2-2 of the second sub partition wall BK2. The first layer BK2-1 of the second sub partition wall BK2 may not include the liquid repellent LRP, or may include only a very small amount of the liquid repellent LRP.

In an embodiment, the liquid repellent LRP may include fluorine. In an embodiment, for example, the liquid repellent LRP may include a fluorine compound. The second sub partition wall BK2 may be formed to include the liquid repellent LRP containing a fluorine compound.

The first base resin RS1 may be composed of various resin compositions which may be generally referred to as a binder. In an embodiment, for example, the first base resin RS1 may be an acryl-based resin, a urethane-based resin, a silicon-based resin, an epoxy-based resin, or the like. The base resin may be a transparent resin. In such an embodiment, the above-described second base resin RS2 and first base resin RS1 may include a same material as each other.

The second layer BK2-2 of the second sub partition wall BK2 may be formed to include the liquid repellent LRP, thereby showing a low surface energy. The surface energy of the second layer BK2-2 of the second sub partition wall BK2 may be controlled in consideration of the surface energy of a color control part resin provided to form the color control parts CCP disposed between the plurality of partition walls BK. The surface energy of the second layer BK2-2 may be lower than the surface energy of the color control part resin, and the surface energy of the first layer BK2-1 under the second layer BK2-2 and the surface energy of the first sub partition wall BK1 may be higher than the surface energy of the color control part resin. In addition, the surface energy of the second layer BK2-2 may be lower than the surface energy of the color control parts CCP, and the surface energies of the first layer BK2-1 and the first sub partition wall BK1 may be higher than the surface energy of the color control parts CCP.

Since the partition wall BK includes the first sub partition wall BK1 and the first layer BK2-1 of the second sub partition wall BK2 which have a higher surface energy than the surface energy of the color control parts CCP, and the second layer BK2-2 of the second sub partition wall BK2 which has a lower surface energy than the surface energy of the color control parts CCP, neighboring color control parts CCP may be distinctly separated from each other with the partition wall BK serving as a boundary therebetween, and in the bank opening BW-OH, adhesion of the color control parts CCP and the partition wall BK may be improved, thereby improving the color quality and durability of the color conversion member CCM.

The second sub partition wall BK2 may include the liquid repellent LRP in a weight ratio of about 0.05 wt % to about 1.0 wt % with respect to the total weight of the second sub partition wall BK2. That is, the liquid repellent LRP may be included in a weight ratio of about 0.05 wt % to about 1.0 wt % with respect to the total weight of the solid content of a resin composition which forms the second sub partition wall BK2. If the content of the liquid repellent LRP in the second sub partition wall BK2 is less than about 0.05 wt %, improvement in liquid repellency may not be sufficiently achieved. If the content of the liquid repellent LRP is more than about 1.0 wt %, the coatability of the resin composition provided in forming the second sub partition wall BK2 may be deteriorated, so that the second sub partition wall BK2 thus formed may not show uniform surface properties.

The second sub partition wall BK2 may have a higher light transmittance than the first sub partition wall BK1. In the disclosure, "light transmittance" in describing the light transmittances of the first sub partition wall BK1 and the second sub partition wall BK2 may mean the transmittance for light in the near infrared region. For example, "light transmittance" may mean light transmittance for light in a wavelength range of about 750 nanometers (nm) to about 900 nm.

The second sub partition wall BK2 may have a light transmittance of about 15% or more. In an embodiment, for example, the second sub partition wall BK2 may have a light transmittance of about 15% to about 100%. The second sub partition wall BK2 may have a light transmittance of about 15% or more with respect to light in the near infrared region. In an embodiment, for example, the second sub partition wall BK2 may have a light transmittance of about 15% or more with respect to light in the wavelength range of about 750 nm to about 900 nm. The light in the near infrared region of about 750 nm to about 900 nm may be used for positioning when a mask of an exposing machine is aligned. In an embodiment of the invention, the second sub partition wall BK2 may have a light transmittance of about 15% or more in the wavelength range of about 750 nm to about 900 nm, thereby easily aligning a mask of an exposing machine.

The first sub partition wall BK1 may have a light transmittance of less than about 15%. The first sub partition wall BK1 may have a light transmittance of less than about 15% with respect to light in the near infrared region. In an embodiment, for example, the first sub partition wall BK1 may have a light transmittance of less than about 15% with respect to light in the wavelength range of about 750 nm to about 900 nm.

In the display device DD according to an embodiment of the invention, since the first sub partition wall BK1 includes the scattering body SP, light emitted from the display panel DP may be scattered by the scattering body SP included in the first sub partition wall BK1, thereby increasing light extraction efficiency. However, the partition wall BK having the scattering body SP may have a reduced light transmittance in a long wavelength region, compared to the partition wall BK having no scattering body SP.

In FIG. 3D, a first graph G1 shows a transmittance versus a wavelength in the first sub partition wall BK1 including the scattering body SP in an amount of about 6 wt % with respect to the total weight of the first sub partition wall BK1. A second graph G2 shows a transmittance versus a wavelength in the first sub partition wall BK1 including the scattering body SP in an amount of about 8 wt % with respect to the total weight of the first sub partition wall BK1. A third graph G3 shows a transmittance versus a wavelength in the first sub partition wall BK1 including the scattering body SP in an amount of about 10 wt % with respect to the total weight of the first sub partition wall BK1.

Referring to FIG. 3D, it may be seen that as the content of the scattering body SP is higher, the light transmittance in the long-wavelength region becomes lower. Referring to the first graph G1, it may be seen that when the content of the scattering body SP is about 6 wt %, the light transmittance near about 900 nm is about 15%, but in the second graph G2 and the third graph G3 in which the content of the scattering body SP is more than about 6 wt %, the light transmittances in the near infrared region of about 750 nm to about 900 nm are all less than about 15%. A phenomenon, in which light, in the long-wavelength region in which light is more easily transmitted than in the short-wavelength region, is inversely scattered and is not transmitted due to introduction of the scattering body SP, may occur. Accordingly, when the content of the scattering body SP is more than about 6 wt %, the scattering body SP may affect an exposing process during formation of the partition wall BK, thereby making it difficult to form a precise pattern. That is, although the partition wall BK including the scattering body SP has a desired characteristic of increasing light-emitting efficiency, light transmittance in the near infrared region used for recognizing the align key AK (see FIG. 6A) is lowered, and thus there is a limitation in increasing the content of the scattering body SP above a predetermined value.

According to an embodiment of the invention, in the display device DD provided with the partition wall BK, the partition wall BK includes the first sub partition wall BK1 including the scattering body SP and the second sub partition wall BK2 disposed on the first sub partition wall BK1, and having a higher light transmittance than the first sub partition wall BK1. Therefore, in such an embodiment, the light transmittance in the near infrared region used for recognition of the align key AK may be easily increased while maintaining the concentration of the scattering body SP in the entire partition wall BK high, and thus the display efficiency and process reliability of the display device DD may be enhanced.

In an embodiment, the second sub partition wall BK2 may not include the scattering body SP. In such an embodiment where the second sub partition wall BK2 does not include the scattering body SP, the light transmittance of the second sub partition wall BK2 in the near infrared region may be maintained to about 15% or more, and therefore the align key AK (see FIG. 6A) may be recognized with more ease. In such an embodiment, the content of the scattering body SP of the first sub partition wall BK1 may be highly maintained, and thus the light-emitting efficiency of the display device DD may be increased.

In an embodiment, the second sub partition wall BK2 may not include a pigment. The second sub partition wall BK2 may be disposed on the first sub partition wall BK1, and prevent the pigment PG included in the first sub partition wall BK1 from being eluted and introduced to peripheral functional layers, for example, the color control part CCP. In a case where the partition wall BK includes only the first sub partition wall BK1 including the pigment PG, a part of the pigment PG may be eluted, causing an afterimage defect. In an embodiment of the invention, since the second sub partition wall BK2 is disposed on the first sub partition wall BK1, an organic material such as a pigment may be prevented from being eluted from the first sub partition wall BK1, thereby minimizing afterimage due to the plurality of partition walls BK.

In an embodiment, the second sub partition wall BK2 may include or be formed from a resin composition including the first base resin RS1, the liquid repellent LRP, and a photoinitiator. The second sub partition wall BK2 may include or be composed of the first base resin RS1, the liquid repellent LRP, and the photoinitiator, but an embodiment of the invention is not limited thereto.

In an embodiment, a height d1 of the first sub partition wall BK1 in the thickness direction DR3 may be in a range of about 5 micrometers (μm) to about 15 μm. IF the height d1 of the first sub partition wall BK1 in the thickness direction is less than about 5 μm or more than about 15 μm, the amount of light scattered from the partition wall BK may not be optimized, thereby deteriorating the color quality and the light efficiency of the color conversion member CCM.

In an embodiment, a height d2 of the second sub partition wall BK2 in the thickness direction DR3 may be in a range of about 0.5 μm to about 5 μm. The height d2 of the second sub partition wall BK2 in the thickness direction DR3 may represent the total height of the first layer BK2-1 and the second layer BK2-2. If the height d2 of the second sub partition wall BK2 in the thickness direction is less than about 0.5 the liquid repellent characteristics of the second sub partition wall BK2 may be deteriorated. If the height d2 of the second sub partition wall BK2 in the thickness direction is more than about 5 μm, the flatness of the light control layer CCL may decrease to deteriorate the durability of the display device DD, and the ratio of the second sub partition wall BK2 in the partition wall BK may increase to deteriorate light-emitting efficiency by the first sub partition wall BK1. In an embodiment where the height of the second sub partition wall BK2 satisfies the aforementioned range, light-emitting efficiency by the partition wall BK may increase, and due to the sufficient liquid repellent characteristics of the second sub partition wall BK2, defects in which the color control parts CCP are lost in a process of forming the color control parts CCP between the partition walls BK, or the partition wall BK patterns are lost in a cleaning process may not occur.

In an embodiment where the partition wall BK pattern is formed by performing exposing and developing processes, an align key may be used for determination of an accurate exposure position. In a case where the partition wall BK includes only the first sub partition wall BK1 including the pigment PG, when exposing is performed for forming the partition wall BK, it is difficult to recognize the align key due to the characteristics of the partition wall BK including a light-blocking pigment and the scattering body, making it difficult to ensure precise alignment. Accordingly, an alignment error occurs between an exposing mask and a substrate. According to an embodiment of the invention, in the display device DD including the plurality of partition walls BK, since the partition walls BK include the first sub partition wall BK1 including the scattering body SP, and the second sub partition wall BK2 disposed on the first sub partition wall BK1 and having a higher light transmittance than the first sub partition wall BK1, the light-emitting efficiency of the display device DD may be improved, and an accurate exposure position may be detected due to easy recognition of the align key AK (see FIG. 6A) in an exposing process for forming the partition wall BK pattern, thereby improving process reliability.

Referring to FIG. 3A again, the color conversion member CCM according to an embodiment may include a plurality of color control parts CCP-R, CCP-G, and CCP-B. Color control parts CCP may be disposed in the bank openings BW-OH. The color control parts CCP may change the optical properties of source light. The color control parts CCP may include a first color control part CCP-R which converts first color light to second color light, a second color control part CCP-G which converts the first color light to third color light, and a third color control part CCP-B which transmits the first color light. The third color light may be light in a longer wavelength region than the first color light, and the second color light may be light in a longer wavelength region than the first color light and the third color light. In an embodiment, for example, the first color light may be blue color light, the second color light may be red color light, and the third color light may be green color light. The first color light may be light in a wavelength region of about 410 nm to about 480 nm, the second color light may be light in a wavelength region of about 625 nm to about 675 nm, and the third color light may be light in a wavelength region of about 500 nm to about 570 nm. In such an embodiment, the first color light may be source light provided to the color control part CCP in the display panel DP.

The third color control part CCP-B may be a transmission part that transmits the first color light without converting the wavelength thereof. A light-emitting body may be included in the first color control part CCP-R and the second color control part CCP-G. The light-emitting body may be a particle that converts the wavelength of incident light and emits light having different wavelength. In an embodiment, the light-emitting body included in the first color control part CCP-R and the second color control part CCP-G may be a quantum dot. However, an embodiment of the invention is not limited thereto, and the third color control part CCP-B may also include the light-emitting body.

The quantum dot may be a particle that converts the wavelength of received light. The core of the quantum dot may be selected from a group II-VI compound, a group III-VI compound, a group compound, a group III-V compound, a group III-II-V compound, a group IV-VI compound, a group IV element, a group IV compound and a combination thereof.

The group II-VI compound may be selected from: a binary compound selected from CdSe, CdTe, CdS, ZnS, ZnSe, ZnTe, ZnO, HgS, HgSe, HgTe, MgSe, MgS, and a mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgZnTe, HgZnS, HgZnSe, HgZnTe, MgZnS, MgZnS and a mixture thereof and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-VI compound may include a binary compound such as $In_2S_3$, $In_2Se_3$, a ternary compound such as $InGaS_3$, $InGaSe_3$, and any combination thereof.

The group compound may be selected from a ternary compound selected from AgInS, $AgInS_2$, CuInS, $CuTnS_2$, $AgGaS_2$, $CuGaS_2CuGaO_2$, $AgGaO_2$, $AgAlO_2$ and a mixture thereof, or a quaternary compound such as $AgInGaS_2$, $CuInGaS_2$.

The group III-V compound may be selected from: a binary compound selected from GaN, GaP, GaAs, GaSb, AlN, AlP, AlAs, AlSb, InN, InP, InAs, InSb and a mixture thereof a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and a mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof. Meanwhile, the group III-V compound may further include a group II metal. For example, InZnP or the like may be selected as the group III-II-V compound.

The group IV-VI compound may be selected from: a binary compound selected from SnS, SnSe, SnTe, PbS, PbSe, PbTe and a mixture thereof; a ternary compound selected from SnSeS, SnSeTe, SnSTe, PbSeS, PbSeTe, PbSTe, SnPbS, SnPbSe, SnPbTe and a mixture thereof, and a quaternary compound selected from SnPbSSe, SnPbSeTe, SnPbSTe and a mixture thereof. The group IV element may be selected from Si, Ge, and a mixture thereof. The group IV compound may be a binary compound selected from SiC, SiGe, and a mixture thereof.

In an embodiment, the binary compound, the ternary compound, or the quaternary compound may be present in a particle with the uniform concentrations, or in the same particle such that the compound is dividedly present with partially different concentration distributions. In addition, the light-emitting body may have a core/shell structure in which one quantum dot surrounds another quantum dot. The core/shell structure has a concentration gradient in which the concentration of an element present in the shell decreases toward the core.

In some embodiments, the quantum dot may have a core-shell structure having a core including a nanocrystal described above, and a shell surrounding the core. The shell of the quantum dot may serve as a protective layer for maintaining semiconductor characteristics by preventing chemical modification of the core, and/or as a charging layer for imparting electrophoretic characteristics to the quantum dot. The shell may be a single- or multi-layer. In an embodiment, the shell of the quantum dot may include a metal or non-metal oxide, a semiconductor compound, a combination thereof, or the like, for example.

In an embodiment, for example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, $CoMn_2O_4$, but the invention is not limited thereto.

In addition, the example of the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the invention is not limited thereto.

The quantum dot may have a full width of half maximum (FWHM) of a light-emitting wavelength spectrum of about 45 nm or less, or about 40 nm or less, e.g., about 30 nm or less, and may improve color purity or color reproducibility in the above range. In addition, since light emitted through the quantum dot is emitted in all directions, the viewing angle of light may be improved.

In addition, the quantum dot has a form generally used in the relevant field, and is not specially limited. However, more specifically, the quantum dot may have a form such as a spherical, pyramidal, multi-armed form, or a cubic nanoparticle, nanotube, nanowire, nanofiber, or nanoplatelet particle.

The quantum dot may control the color of light emitted depending on the particle size thereof, and accordingly, may have various light-emitting colors such as a blue color, a red color, or a green color. In an embodiment, the quantum dot included in the first color control part CCP-R overlapping the first pixel region PXA-R may have a red light-emitting color. The smaller particle size of the quantum dot may cause the quantum dot to emit light in a shorter wavelength region. For example, in the quantum dots having a same core as each other, the quantum dot emitting green color light may have a smaller particle size than the quantum dot emitting red color light. In addition, in the quantum dots having the same core, the quantum dot emitting blue color light may have a smaller particle size than the quantum dot emitting green color light. However, an embodiment of the invention is not limited thereto, and even in the quantum dots having the same core, the particle size thereof may be adjusted according to a shell-forming material, a shell thickness, and the like.

In a case where the quantum dots have various light-emitting colors such as a blue color, a red color, or a green color, the quantum dots having different light-emitting colors may respectively have different core materials from each other.

The color control parts CCP may further include a scattering body. In an embodiment, for example, the first color control part CCP-R may include a quantum dot that converts blue color light to red color light, and a scattering body that scatters light. The second color control part CCP-G may include a quantum dot that converts blue color light to green color light, and a scattering body that scatters light. The scattering body may be a particle that increases light-emitting efficiency by scattering light.

The scattering body may be an inorganic particle. In an embodiment, for example, the scattering body may include at least one selected from $TiO_2$, ZnO, $Al_2O_3$, $SiO_2$, and hollow silica. The scattering body may include at least one selected from $TiO_2$, ZnO, $Al_2O_3$, $SiO_2$, and hollow silica, or may be a mixture of at least two materials selected from $TiO_2$, ZnO, $Al_2O_3$, $SiO_2$, and hollow silica.

The color control parts CCP may each include a base resin in which the quantum dot and the scattering body are dispersed. The base resin is a medium in which the quantum dot and the scattering body are dispersed, and may be composed of various resin compositions generally referred to as a binder. In an embodiment, for example, the base resin may be an acryl-based resin, a urethane-based resin, a silicon-based resin, an epoxy-based resin, or the like. The base resin may be a transparent resin.

In an embodiment, the color control parts CCP may be formed by an inkjet process. A liquid composition is provided in the bank opening BW-OH. The volume of the composition which is polymerized by a thermal curing process or a light curing process is reduced after curing.

Steps (or a step structure) may occur between the upper surfaces of the partition walls BK and the upper surfaces of the color control parts CCP. That is, the upper surfaces of the partition walls BK may be defined to be higher than the upper surfaces of the color control parts CCP. The height differences between the upper surfaces of the partition walls BK and the upper surfaces of the color control parts CCP may be, for example, about 2 μm to about 3 μm.

The light control layer CCL may include a first barrier layer CAP1. The light control layer CCL may include the first barrier layer CAP1 spaced apart from the display element layer DP-ED with the color control parts CCP therebetween. The first barrier layer CAP1 may block moisture and/or oxygen (hereinafter, referred to as 'moisture/oxygen') from infiltrating into the color control parts CCP. The first barrier layer CAP1 may be disposed on the upper surfaces or lower surfaces of the color control parts CCP, thereby blocking the color control parts CCP from being exposed to moisture/oxygen, and specially blocking the quantum dots included in the color control parts CCP from being exposed to moisture/oxygen. In addition, the first barrier layer CAP1 may protect the color control parts CCP from an external impact.

In an embodiment, the first barrier layer CAP1 may be disposed adjacent to a color filter layer CFL. That is, the first barrier layer CAP1 may be disposed on the upper surfaces of the color control parts CCP. The first barrier layer CAP1 may cover the upper surfaces of the color control parts CCP adjacent to the color filter layer CFL. In addition, the first barrier layer CAP1 may cover not only the color control part CCP, but also the plurality of partition walls BK.

The first barrier layer CAP1 may be disposed along the steps between the plurality of partition walls BK and the color control parts CCP. The first barrier layer CAP1 may cover the upper surfaces of the plurality of partition walls BK and the upper surfaces of the color control parts CCP which are adjacent to the color filter layer CFL. The first barrier layer CAP1 may be directly disposed under a low refractive layer LR.

The first barrier layer CAP1 may include an inorganic material. In the display device DD according to an embodiment, the first barrier layer CAP1 may include silicon oxynitride (SiON), but an embodiment of the invention is not limited thereto.

In an embodiment, the first barrier layer CAP1 may further include an organic film. The first barrier layer CAP1 may be defined by or composed of a single layer or a plurality of layers. In the first barrier layer CAP1, the inorganic film may protect the color control parts CCP from external humidity, and the organic film may remove the steps defined by the plurality of partition walls BK and the color control parts CCP, and may provide a flat base surface to a member to be disposed thereon.

The color conversion member CCM according to an embodiment may further include the color filter layer CFL. The color filter layer CFL may be disposed between the base layer BL and the light control layer CCL. The color filter layer CFL may include the filter part CF. The filter part CF includes at least one color filter. The color filter transmits light in a specific wavelength range, and blocks light in a wavelength range other than the specific wavelength range.

The filter part CF may include a plurality of color filters CF1, CF2, and CF3. That is, the color filter layer CFL may include a first color filter CF1 that transmits second light, a second color filter CF2 that transmits third light, and a third color filter CF3 that transmits first light. In an embodiment, for example, the first color filter CF1 may be a red color filter, the second color filter CF2 may be a green color filter, and the third color filter CF3 may be a blue color filter.

The color filters CF1, CF2, and CF3 may each include a polymer photosensitive resin and a pigment or dye. The first color filter CF1 may include a red color pigment or dye, the second color filter CF2 may include a green color pigment or dye, and the third color filter CF3 may include a blue color pigment or dye.

However, an embodiment of the invention is not limited thereto, and the third color filter CF3 may not include a pigment or dye. The third color filter CF3 may include a polymer photosensitive resin, and may not include a pigment or dye. The third color filter CF3 may be transparent. The third color filter CF3 may include or be formed of a transparent photosensitive resin.

The color filters CF1, CF2, and CF3 may respectively have uniform thicknesses in the pixel regions PXA-R, PXA-G, and PXA-B, that is, portions of the color filters CF1, CF2, and CF3 in the pixel regions PXA-R, PXA-G, and PXA-B may respectively have uniform or constant thicknesses. The first color filter CF1 may have a uniform thickness in the first pixel region PXA-R. The second color filter CF2 may have a uniform thickness in the second pixel region PXA-G. The third color filter CF3 may have a uniform thickness in the third pixel region PXA-B. Accordingly, light converted through the color control parts CCP from source light which is blue light may be provided to the outside with uniform luminance in the pixel regions PXA-R, PXA-G, and PXA-B.

The color filter layer CFL may include the low refractive layer LR. The low refractive layer LR may be disposed between the light control layer CCL and the color filters CF1, CF2, and CF3. The low refractive layer LR may be disposed on the light control layer CCL to block the color control parts CCP from being exposed to moisture/oxygen. In addition, the low refractive layer LR may be disposed between the color control parts CCP and the color filters CF1, CF2, and CF3 to serve as an optical functional layer which, for example, increases light extraction efficiency or prevents reflected light from being incident onto the light control layer CCL. The low refractive layer LR may have a lower refractive index than adjacent layers thereof.

The low refractive layer LR may include at least one inorganic layer. In an embodiment, for example, the low refractive layer LR may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, a metal thin film having desired light transmittance, or the like. However, an embodiment of the invention is not limited thereto, and the low refractive layer LR may include an organic film. In an embodiment, for example, the low refractive layer LR may be formed to include a polymer resin, inorganic particles, etc. The low refractive layer LR may be defined by or composed of a single layer or a plurality of layers.

In the display device DD according to an embodiment, the color filters CF1, CF2, and CF3 of the color filter layer CFL may be directly disposed on the light control layer CCL. In such an embodiment, the low refractive layer LR may be omitted.

The display panel DP according to an embodiment may further include the base layer BL disposed on the color filter layer CFL. The base layer BL may be a member providing a base surface on which the color filter layer CFL, the light control layer CCL, etc., are disposed. The base layer BL may be a glass substrate, a metal substrate, a plastic substrate, or the like. However, an embodiment of the invention is not limited thereto, and the base layer BL may be an inorganic layer, an organic layer, or a composite material layer. Alternatively, the base layer BL may be omitted.

Although not illustrated, an anti-reflective layer may be disposed on the base layer BL. The anti-reflective layer may reduce the reflectance of external light incident from the outside. The anti-reflective layer may selectively transmit light emitted from the display panel DP. In an embodiment, the anti-reflective layer may be a single layer including a dye and/or pigment dispersed in a base resin. The anti-reflective layer may be provided as one continuous layer entirely overlapping the entirety of the first to third pixel regions PXA-R, PXA-G, and PXA-B.

In an embodiment, the anti-reflective layer may not include a polarization layer. Accordingly, light passing through the anti-reflective layer and incident onto the display element layer DP-ED may be non-polarized light. The display element layer DP-ED may receive non-polarized light from above the anti-reflective layer.

In an embodiment, the display device DD according to an embodiment may further include a filling layer FML (see FIG. 4A) disposed between the color conversion member CCM and the display panel DP. In such an embodiment, the color conversion member CCM and the display panel DP may be formed in separate processes, and may be bonded in a bonding process. In an embodiment where the filling layer FML (see FIG. 4A) is further included between the color conversion member CCM and the display panel DP, the plurality of partition walls BK may not be directly disposed on the display panel DP. In such an embodiment, since the color conversion member CCM and the display panel DP are formed in separate processes, the plurality of partition walls BK may be formed on a base surface provided by a functional layer such as the base layer BL or the color filter layer CFL which is included in the color conversion member CCM.

Figure 4A:
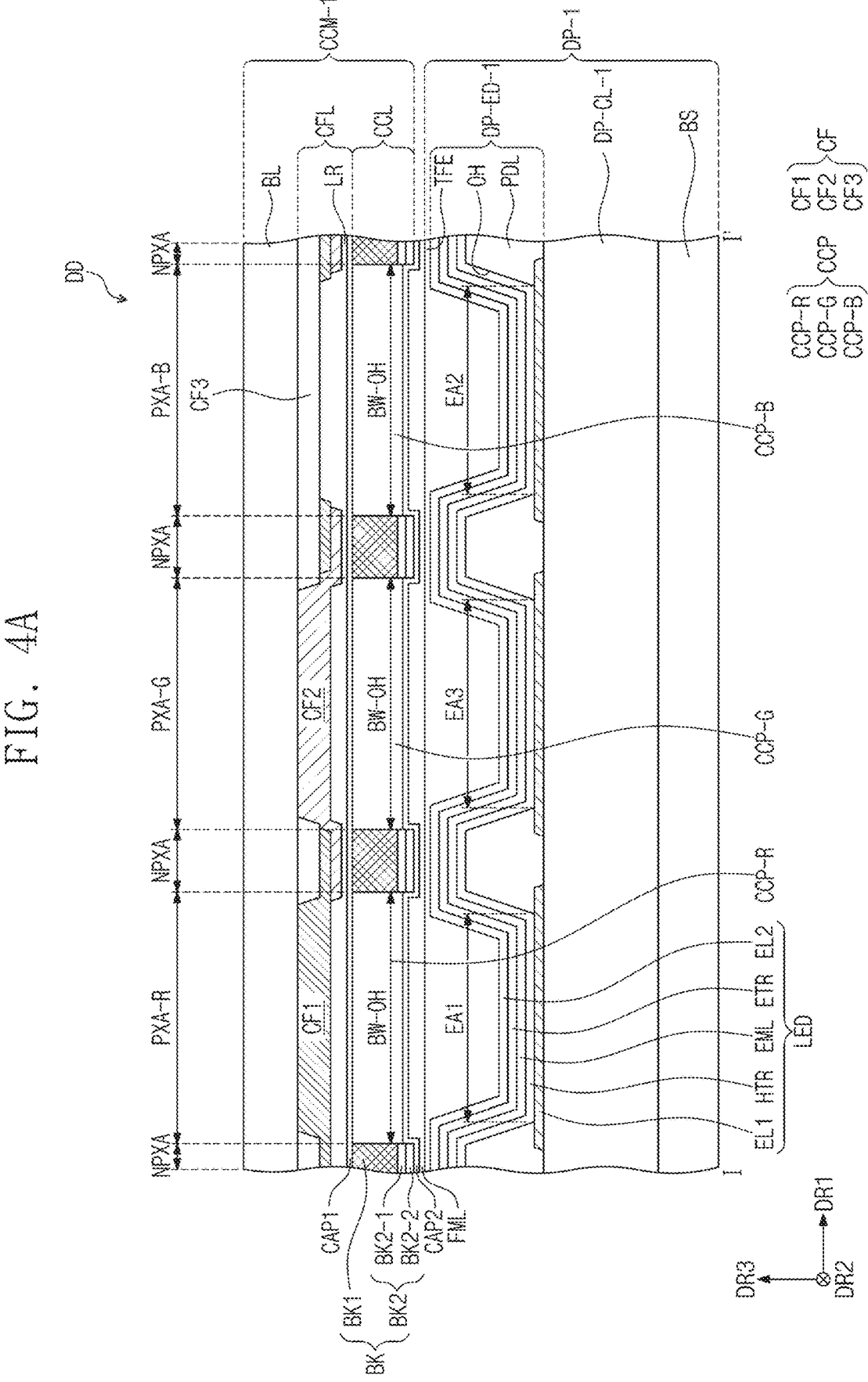
FIG. 4A is a cross-sectional view of a display device according to an embodiment of the invention.
Figure 4B:
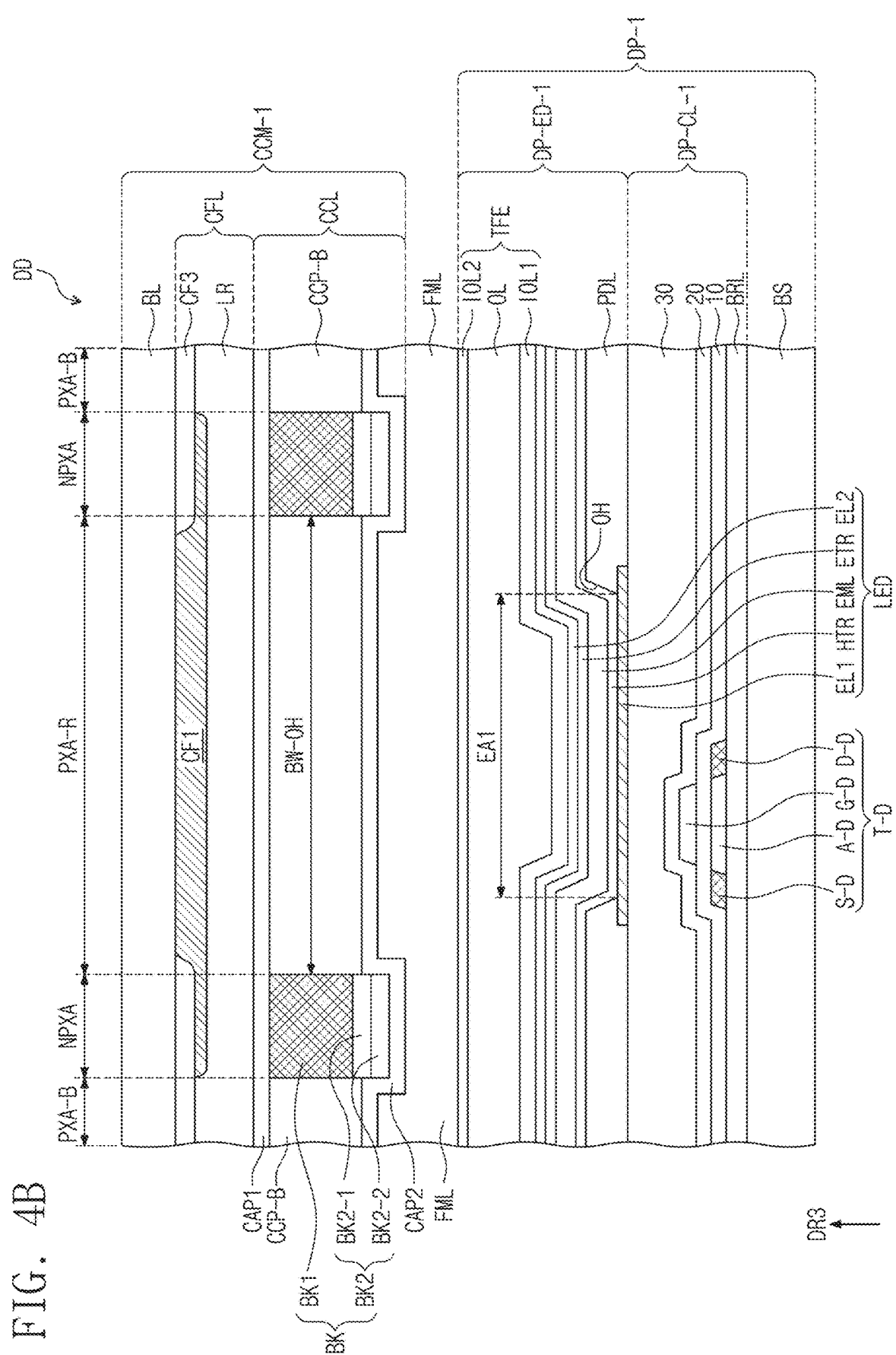
FIG. 4B is an enlarged cross-sectional view illustrating a portion of a display device according to an embodiment of the invention.

FIG. 4A is a cross-sectional view of a display device DD according to an embodiment of the invention. FIG. 4B is an enlarged cross-sectional view illustrating a part of a display device according to an embodiment of the invention. Hereinafter, in describing the display device DD according to an embodiment of the invention with reference to FIGS. 4A and 4B, the same or like reference numerals or symbols are used for the same or like components described above with reference to FIG. 2A to FIG. 3C, and any repetitive detailed description thereof will be omitted or simplified.

In an embodiment, as shown in FIG. 4A, a display panel DP-1 included in the display device DD according to an embodiment may be an organic electroluminescent display panel, or a quantum dot light-emitting display panel. Hereinafter, for convenience of description, embodiments where the display panel DP-1 is an organic electroluminescent display panel will be described in detail, but not being limited thereto. Alternatively the display panel DP-1 according to an embodiment may be a quantum dot light-emitting display panel. In the quantum dot light-emitting display panel, the same description of the display panel DP-1 to be described later may also be applied except that the quantum dot is used as a light-emitting material.

The display device DD according to an embodiment illustrated in FIG. 4A is substantially the same as the display device DD illustrated in FIG. 3A, except that the light control layer CCL may further include a second barrier layer CAP2, and a filling layer FML disposed between a color conversion member CCM-1 and the display panel DP-1. However, an embodiment of the invention is not limited thereto, and the second barrier layer CAP2 or the filling layer FML may be omitted.

The display panel DP-1 according to an embodiment includes a base substrate BS, a circuit layer DP-CL-1 disposed on the base substrate BS, and a display element layer DP-ED-1 disposed on the circuit layer DP-CL-1. The display element layer DP-ED-1 may include pixel-defining films PDL, an organic electroluminescent element LED disposed between the pixel-defining films PDL, and a thin film encapsulation layer TFE disposed on the organic electroluminescent element LED.

The circuit layer DP-CL-1 may be disposed on the base substrate BS. The circuit layer DP-CL-1 may include an insulating layer, a semiconductor pattern, a conductive pattern, a signal line, etc. An insulating layer, a semiconductor layer, and a conductive layer may be formed on the base substrate BS through coating, deposition, etc., and may be selectively patterned by performing a photolithography process multiple times. Thereafter, a semiconductor pattern, a conductive pattern, and a signal line included in the circuit layer DP-CL-1 may be formed. In an embodiment, the circuit layer DP-CL-1 may include a transistor, a buffer layer, and a plurality of insulating layers.

The organic electroluminescent element LED according to an embodiment may include a first electrode EL1, a second electrode EL2 facing the first electrode EL1, and a light-emitting layer EML disposed between the first electrode EL1 and the second electrode EL2. The light-emitting layer EML included in the organic electroluminescent element LED may include an organic light-emitting material as a light-emitting material. The organic electroluminescent element LED may further include a hole control layer HTR and an electron control layer ETR. In an embodiment, although not illustrated, the organic electroluminescent element LED may further include a capping layer (not shown) disposed on the second electrode EL2.

The pixel-defining film PDL may be disposed on the circuit layer DP-CL-1, and may cover a part of the first electrode EL1. A light-emitting opening OH is defined in the pixel-defining film PDL. The light-emitting opening OH of the pixel-defining film PDL may expose at least a part of the first electrode ELL In an embodiment, light-emitting regions EA1, EA2, and EA3 are defined to correspond to partial regions of the first electrode EL1 exposed by the light-emitting opening OH.

The pixel-defining film PDL may include or be formed of a polymer resin. In an embodiment, for example, the pixel-defining film PDL may be formed to include a polyacrylate-based resin, or a polyimide-based resin. In addition, the pixel-defining film PDL may be formed to further include an inorganic material in addition to the polymer resin. In an embodiment, the pixel-defining film PDL may be formed to include a light-absorbing material, or a black pigment or black dye. In addition, the pixel-defining film PDL may include or be formed of an inorganic material. In an embodiment, for example, the pixel-defining film PDL may be formed to include silicon nitride ($SiN_x$), silicon oxide ($SiO_x$), silicon oxynitride ($SiO_xN_y$), or the like. The pixel-defining film PDL may define the pixel regions PXA-R, PXA-G, and PXA-B. The pixel regions PXA-R, PXA-G, and PXA-B and the peripheral region NPXA may be distinguished by the pixel-defining film PDL.

The pixel-defining film PDL may overlap the partition wall BK. That is, a plurality of pixel-defining films PDL may overlap and correspond to a plurality of partition walls BK, respectively.

The display element layer DP-ED-1 may include a first light-emitting region EA1, a second light-emitting region EA2, and a third light-emitting region EA3. The first light-emitting region EA1, the second light-emitting region EA2, and the third light-emitting region EA3 may be regions distinguished by the pixel-defining films PDL. The first light-emitting region EA1, the second light-emitting region EA2, and the third light-emitting region EA3 may respectively correspond to the first pixel region PXA-R, the second pixel region PXA-G, and the third pixel region PXA-B. When seen on a plane, the areas of the pixel regions PXA-R, PXA-G, and PXA-B distinguished by the plurality of partition walls BK may be larger than the areas of the light-emitting regions EA1, EA2, and EA3 distinguished by the pixel-defining films PDL.

On a plane, the bank opening BW-OH overlaps the light-emitting opening OH, and has a larger area than the light-emitting opening OH. That is, the bank opening BW-OH may have a larger area than the light-emitting regions EA1, EA2, and EA3 defined by the light-emitting opening OH.

In the organic electroluminescent element LED, the first electrode EL1 is disposed on the circuit layer DP-CL-1. The first electrode EL1 may be an anode or a cathode. In addition, the first electrode EL1 may be a pixel electrode. The first electrode EL1 may be a transmissive electrode, a transflective electrode, or a reflective electrode.

The hole control layer HTR may be disposed between the first electrode EL1 and the light-emitting layer EML. The hole control layer HTR may include at least one selected from a hole injection layer, a hole transport layer, and an electron-blocking layer. The hole control layer HTR may be disposed as a common layer to overlap the light-emitting regions EA1, EA2, and EA3 and the entirety of the pixel-defining films PDL by which the light-emitting regions EA1, EA2, and EA3 are distinguished. However, an embodiment of the invention is not limited thereto, and the hole control layer HTR may be provided by being patterned to be separately disposed corresponding to each of the light-emitting regions EA1, EA2, and EA3.

The light-emitting layer EML is disposed on the hole control layer HTR. In an embodiment, the light-emitting layer EML may be provided as a common layer to overlap the light-emitting regions EA1, EA2, and EA3 and the entirety of the pixel-defining films PDL by which the light-emitting regions EA1, EA2, and EA3 are distinguished. In an embodiment, the light-emitting layer EML may emit blue color light. The light-emitting layer EML may overlap the entirety of the hole control layer HTR and the electron control layer ETR.

However, an embodiment of the invention is not limited thereto, and in an alternative embodiment, the light-emitting layer EML may be disposed in the light-emitting opening OH. That is, the light-emitting layer EML may be separately formed to correspond to the light-emitting regions EA1, EA2, and EA3 distinguished by the pixel-defining film PDL. The light-emitting layer EML separately formed to correspond to the light-emitting regions EA1, EA2, and EA3 may all emit blue color light, or light in wavelength ranges different from each other.

The light-emitting layer EML may be a single layer composed of a single material, a single layer composed of a plurality of materials different from each other, or a multi-layered structure having a plurality of layers composed of a plurality of materials different from each other. The light-emitting layer EML may include a fluorescent or phosphorescent material. In an organic electroluminescent element according to an embodiment, the light-emitting layer EML may include a light-emitting material such as an organic light-emitting material, a metal organic complex, and a quantum dot. In FIG. 4A and FIG. 4B, an embodiment where an organic electroluminescent element LED includes a single light-emitting layer EML is exemplarily illustrated, but in an embodiment, the organic electroluminescent element LED may include a plurality of light-emitting stacks each including at least one light-emitting layer.

The thin film encapsulation layer TFE may be disposed on the organic electroluminescent element LED, and on the second electrode EL2. The thin film encapsulation layer TFE may be directly disposed on the second electrode EL2. The thin film encapsulation layer TFE may be a single layer or a stack of a plurality of layers.

The color conversion member CCM-1 is disposed on the display panel DP-1. The color conversion member CCM-1 may include a light control layer CCL, a color filter layer CFL, and a base layer BL. In an embodiment, for example, the display panel DP-1 may include the organic electroluminescent element LED emitting first color light, and the color conversion member CCM-1 may include the color control parts CCP that converts the wavelength of the first color light provided from the organic electroluminescent element LED or transmits the first color light.

The display device DD according to an embodiment illustrated in FIG. 4A and FIG. 4B may include the peripheral region NPXA and the pixel regions PXA-R, PXA-G, and PXA-B. The pixel regions PXA-R, PXA-G, and PXA-B may be each a region in which light generated from the organic electroluminescent element LED is emitted. As described above with reference to FIG. 3A and FIG. 3B, the area of each of the pixel regions PXA-R, PXA-G, and PXA-B may be different from each other, and the area may mean an area as seen on a plane.

In the display device DD according to an embodiment, as illustrated in FIG. 4A and FIG. 4B, the display panel DP-1 may include the organic electroluminescent element LED including the light-emitting layer EML as a common layer. That is, in the display device DD according to an embodiment illustrated in FIG. 4A and FIG. 4B, the display panel DP-1 may emit light in a same wavelength range regardless of the pixel regions PXA-R, PXA-G, and PXA-B of the display device DD. In an embodiment, for example, the display panel DP-1 may provide blue color light, which is the first color light, from the color conversion member CCM-1.

In an embodiment, as illustrated in FIG. 4A and FIG. 4B, the display device DD according to an embodiment may further include a filling layer FML disposed between the color conversion member CCM-1 and the display panel DP-1. The filling layer FML may fill a space between the display panel DP-1 and the color conversion member CCM-1. The color conversion member CCM-1 and the display panel DP-1 may be bonded after formed in separate processes, and may be bonded to each other with the filling layer FML therebetween in a bonding process. Accordingly, unlike the plurality of partition walls BK included in the display device DD illustrated in FIG. 3A, the plurality of partition walls BK included in the display device DD illustrated in FIG. 4A may not be directly disposed on the display panel DP-1, and may be disposed spaced apart from each other with the filling layer FML therebetween.

In the display device DD illustrated in FIG. 4A, the plurality of partition walls BK may be formed on a base surface provided by a functional layer included in the color conversion member CCM, for example, the base layer BL or the color filter layer CFL. Accordingly, the first sub partition wall BK1 may be disposed adjacent to the color filter layer CFL, and the second sub partition wall BK2 may be disposed spaced apart from the color filter layer CFL with the first sub partition wall BK1 therebetween. The second sub partition wall BK2 may be disposed under the first sub partition wall BK1. The second sub partition wall BK2 may be directly disposed under the first sub partition wall BK1. The second sub partition wall BK2 may include a first layer BK2-1 adjacent to the first sub partition wall BK1 and a second layer BK2-2 disposed under the first layer BK2-1. The first layer BK2-1 of the second sub partition wall BK2 may be directly disposed under the first sub partition wall BK1, and the second layer BK2-2 may be disposed spaced apart from the first sub partition wall BK1 with the first layer BK2-1 therebetween.

In such an embodiment, the first sub partition wall BK1 and the second sub partition wall BK2 included in each of the plurality of partition walls BK may be same as those described above with reference to FIG. 3A to FIG. 3D except that the stack structure in the display device DD is different.

The filling layer FML may function as a buffer between the display panel DP-1 and the color conversion member CCM-1. In an embodiment, the filling layer FML may have an impact-absorbing function, etc., and may increase the strength of the display device DD. The filling layer FML may be formed from a filling resin including a polymer resin. In an embodiment, for example, the filling layer FML may be formed from a filling resin including an acryl-based resin, an epoxy-based resin, or the like.

The filling layer FML and the second barrier layer CAP2 may be different components and respectively formed in separate processes. The filling layer FML and the second barrier layer CAP2 may be formed of materials different from each other.

Steps may occur between the lower surfaces of the plurality of partition walls BK and the lower surfaces of the color control parts CCP. The lower surfaces of the color control parts CCP may be defined to be higher than the lower surfaces of the plurality of partition walls BK. The height differences between the lower surfaces of the plurality of partition walls BK and the lower surfaces of the color control parts CCP may be, for example about 2 µm to about 3 µM.

The light control layer CCL may include the first barrier layer CAP1 and the second barrier layer CAP2. The first barrier layer CAP1 and the second barrier layer CAP2 may serve to block moisture and/or oxygen (hereinafter, referred to as 'moisture/oxygen') from infiltrating into the color control parts CCP. The first barrier layer CAP1 and the second barrier layer CAP2 may be respectively disposed on a part of the upper surfaces of the color control parts CCP and a part of the lower surfaces of the color control parts CCP, and may block the color control parts CCP from being exposed to moisture/oxygen. Specifically, quantum dots included in the color control parts CCP may be blocked from being exposed to moisture/oxygen. In addition, the first barrier layer CAP1 and the second barrier layer CAP2 may protect the color control parts CCP from an external impact.

In an embodiment, the second barrier layer CAP2 may be disposed adjacent to the display element layer DP-ED-1. That is, the second barrier layer CAP2 may be disposed on the lower surfaces of the color control parts CCP. In an embodiment, the light control layer CCL may include the first barrier layer CAP1 spaced apart from the display element layer DP-ED-1 with the color control parts CCP therebetween. The second barrier layer CAP2 may cover the lower surfaces of the color control parts CCP adjacent to the display element layer DP-ED-1, and the first barrier layer CAP1 may cover the upper surfaces of the color control parts CCP adjacent to the color filter layer CFL. However, an embodiment of the invention is not limited thereto, and one of the first barrier layer CAP1 and the second barrier layer CAP2 may be omitted.

In an embodiment, the first barrier layer CAP1 and the second barrier layer CAP2 may cover not only the color control parts CCP but also the plurality of partition walls BK.

The second barrier layer CAP2 may be disposed along the steps between the plurality of partition walls BK and the color control parts CCP. The second barrier layer CAP2 may cover the lower surfaces of the plurality of partition walls BK and the lower surfaces of the color control parts CCP which are adjacent to the display panel DP. The first barrier layer CAP1 may be directly disposed under the low refractive layer LR.

The first barrier layer CAP1 and the second barrier layer CAP2 may each include an inorganic material. In the display device DD according to an embodiment, the first barrier layer CAP1 and the second barrier layer CAP2 may each include silicon oxynitride, but an embodiment of the invention is not limited thereto. The first barrier layer CAP1 disposed on the color control parts CCP may include silicon oxide ($SiO_x$), and the second barrier layer CAP2 disposed under the color control parts CCP may include silicon oxynitride, but an embodiment of the invention is not limited thereto.

In an embodiment, each of the first barrier layer CAP1 and the second barrier layer CAP2 may further include an organic film. The barrier layers CAP1 and CAP2 may be each composed of a single layer, or a plurality of layers. In the barrier layers CAP1 and CAP2, an inorganic film may protect the color control parts CCP from external humidity, and an organic film may remove steps defined by the partition walls BK and the color control parts CCP, and may provide a flat base surface for a member to be disposed thereon.

Figure 5A:
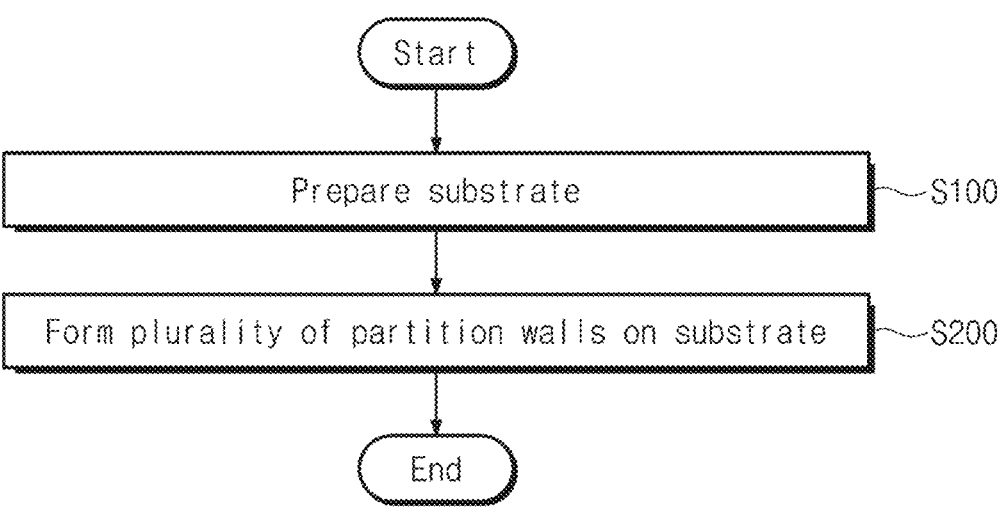
FIG. 5A is a flowchart illustrating a manufacturing method of a display device according to an embodiment of the invention.
Figure 5B:
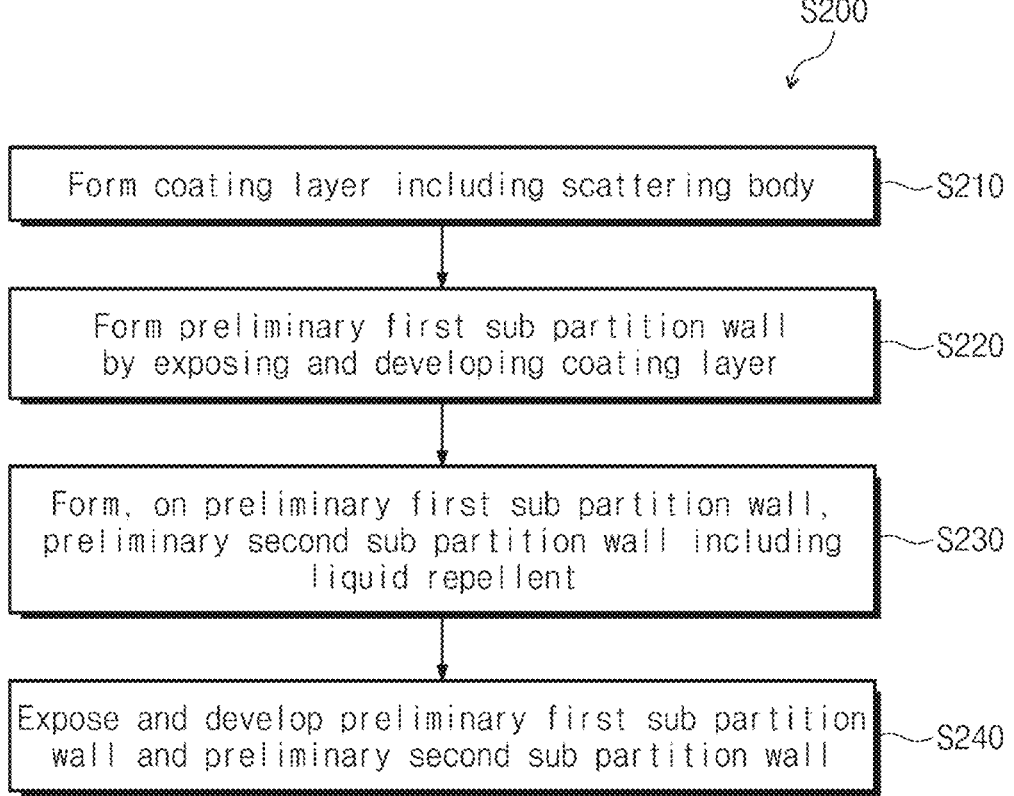
FIG. 5B is a flowchart illustrating sub-processes for forming a plurality of partition walls according to an embodiment of the invention.

FIG. 5A is a flowchart illustrating a manufacturing method of a display device according to an embodiment. FIG. 5B is a flowchart illustrating sub-processes for forming a plurality of partition walls according to an embodiment.

Referring to FIG. 5A, a manufacturing method of a display device according to an embodiment may include an operation (S100) of preparing a substrate, and an operation (S200) of providing or forming a plurality of partition walls on the substrate.

Referring to FIG. 5B, the operation (S200) of providing or forming a plurality of partition walls according to an embodiment includes an operation (S210) of providing or forming a coating layer including a scattering body, an operation (S220) of forming a preliminary first sub partition wall by exposing and developing the coating layer, an operation (S230) of providing or forming, on the preliminary first sub partition wall, a preliminary second sub partition wall including a liquid repellent, and an operation (S240) of exposing and developing the preliminary first sub partition wall and the preliminary second sub partition wall.

FIGS. 6A to 6H are cross-sectional views illustrating operations of a manufacturing method of a display device according to an embodiment of the invention. In FIGS. 6A to 6H, operations of forming a plurality of partition walls of the manufacturing method of a display device according to an embodiment of the invention are sequentially illustrated. Hereinafter, in describing the manufacturing method of a display device according to an embodiment with reference to FIGS. 6A to 6H, the same or like reference numerals and symbols are used for the same or like components described above, and any repetitive detailed description thereof will be omitted or simplified.

The manufacturing method of s display device according to an embodiment of the invention includes an operation of preparing a substrate, and an operation of providing or forming a plurality of partition walls on the substrate.

Figure 6A:
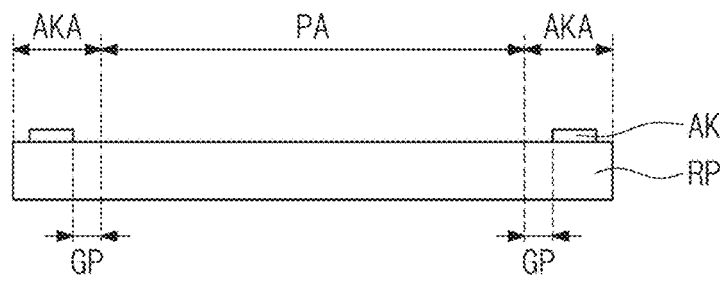
FIGS. 6A to 6H are cross-sectional views illustrating operations of a manufacturing method of a display device according to an embodiment of the invention.

Referring to FIG. 6A, the operation of providing or forming the plurality of partition walls BK of the manufacturing method of a display device according to an embodiment may include an operation of providing a substrate RP on which the plurality of partition walls BK are formed. The substrate RP may provide a base surface on which the plurality of partition walls BK are formed. In an embodiment, for example, the substrate RP may be a base substrate BS (see FIG. 3A) described above with reference to FIGS. 3A to 3D, and a circuit layer DP-CL (see FIG. 3A) and a display element layer DP-ED (see FIG. 3A) disposed on the base substrate BS may be omitted without being illustrated. Alternatively, the substrate RP may be a base layer BL (see FIG. 4A) described above with reference to FIGS. 4A and 4B, and a color filter layer CFL (see FIG. 4A) disposed on the base layer BL (see FIG. 4A) may be omitted without being illustrated.

Referring to FIG. 6A, the substrate RP may include a panel region PA and an align key region AKA. The panel region PA of the substrate RP may include a display panel DP illustrated in FIG. 3A, etc., and the plurality of partition walls BK may be provided or formed on a base surface provided by a functional layer included in the display panel DP. In an embodiment, for example, the plurality of partition walls BK may be provided or formed on a base surface provided by the base substrate BS, the circuit layer DP-CL, the display element layer DP-ED, or the like illustrated in FIG. 3A, etc., but an embodiment of the invention is not limited thereto. The panel region PA of the substrate RP may include a functional layer included in a color conversion member CCM, and the plurality of partition walls BK may be provided or formed on a base surface provided the functional layer included in the color conversion member CCM. In an embodiment, for example, the plurality of partition walls BK may be provided or formed on a base surface provided by the base layer BL, the color filter layer CFL, or the like. The align key region AKA of the substrate RP may be a region in which an align key AK is formed.

The align key AK may be provided or disposed on the substrate RP. The align key AK may be formed on the edge of the substrate RP to overlap the align key region AKA. The align key AK may be provided on the substrate RP for aligning to a mask to be described later. In an embodiment, for example, the align key AK may be an alignment criterion of the substrate RP and a second mask MK2 to be described later. The align key AK may be disposed spaced apart from the panel region PA with a predetermined spacing GP. In an embodiment, for example, the align key AK may be disposed spaced apart from the panel region PA with a spacing of about 5 mm or more, but an embodiment of the invention is not limited thereto.

Figure 6B:
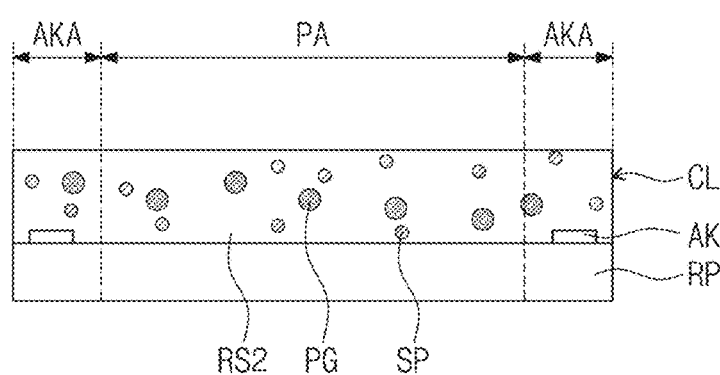

Referring to FIG. 6B, a coating layer CL including a scattering body SP and a pigment PG may be provided or formed on the substrate RP. The coating layer CL may be formed on the substrate RP to cover the align key AK. An operation of forming the coating layer CL may include an operation of providing, on the substrate RP, a resin composition including the scattering body SP and the pigment PG. The scattering body SP and the pigment PG may be provided being dispersed in a second base resin RS2.

In an embodiment, the resin composition for forming the coating layer CL may further include at least one photoinitiator. In such an embodiment where the resin composition of forming the coating layer CL includes a plurality of photoinitiators, the photoinitiators different from each other may be activated by ultraviolet light having central wavelengths different from each other.

The photoinitiator may be one selected from 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, and 2-hydroxy-1-{4-[4-(2-hydroxy-2-methyl-propionyl)-benzyl]-phenyl}-2-methylpropan-1-one.

In addition, the photoinitiator may be any one selected from among 2-methyl-1 [4-(methylthio)phenyl]-2-morpholinopropan-1-one, 2-benzyl-2-dimethylamino-1-(4-morpholinophenyl)-butanone-1,2-dimethyl amino-2-(4-methylbenzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl)heptylideneamino]benzoate, [1-[9-ethyl-6-(2-methylbenzoyl)carbazol-3-yl]ethylideneamino] acetate, and bis(2,4-cyclopentadienyl)bis[2,6-difluoro-3-(1-pyrryl)phenyl] titanium(IV).

A method for forming the coating layer CL is not specially limited, and a method such as spin coating, casting, Langmuir-Blodgett method, inkjet printing, laser printing or laser induced thermal imaging (LITI) may be used.

In an embodiment, although not illustrated, after the operation of forming the coating layer CL on the substrate RP, at least one process selected from vacuum chamber dry (VCD) process and pre-bake (PRB) process may be performed. In an embodiment, for example, after forming the coating layer CL on the substrate RP, the pre-bake process may be performed after the VCD process. Specific conditions such as temperature and time of the pre-bake process may be appropriately selected depending on the type and capacity of the material. However, an embodiment of the invention is not limited thereto, the VCD process and pre-bake process may be omitted in some cases.

Figure 6C:
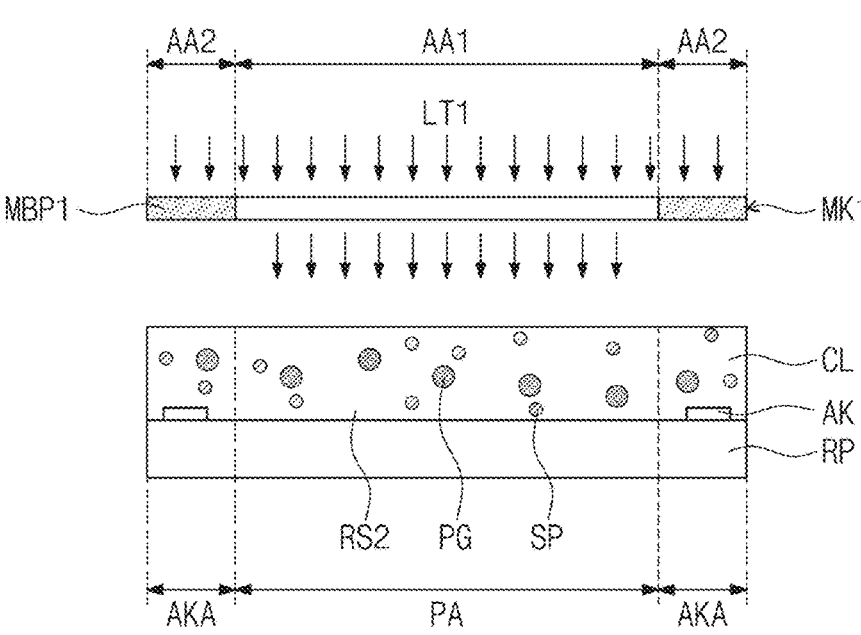

Referring to FIG. 6C, an operation of aligning a first mask MK1 on the substrate RP may be performed. The first mask MK1 may include a first region AA1 and a second region AA2. The first region AA1 may be a region corresponding to the panel region PA of the substrate RP. The second region AA2 may be a region corresponding to the align key region AKA of the substrate RP. The first mask MK1 may include a first light-blocking part MBP1 corresponding to the second region AA2. The first light-blocking part MBP1 of the first mask MK1 may be disposed corresponding to the second region AA2.

After aligning the first mask MK1 on the substrate RP, an operation of exposing the coating layer CL may be performed. The operation of exposing the coating layer CL may be an operation of radiating a first light LT1 from above the first mask MK1. The first light LT1 may be provided using a projection-type exposing machine. When the first light LT1 is radiated through the first mask MK1, since the first light LT1 pass through the first region AA1 of the first mask MK1, the coating layer CL corresponding to the panel region PA may be exposed. In addition, the first light LT1 incident onto the second region AA2 may be blocked by the first light-blocking part MBP1, such that the coating layer CL in the align key region AKA may not be exposed. In an embodiment, in the operation of exposing the coating layer CL, the coating layer CL overlapping the panel region PA may be under-exposed. Since the coating layer CL overlapping the panel region PA is under-exposed, while the coating layer CL is not entirely exposed in the thickness direction, and only the surface thereof may be exposed. Here, being under-exposed means being exposed with light having an energy of less than an optimal exposure energy.

Figure 6D:
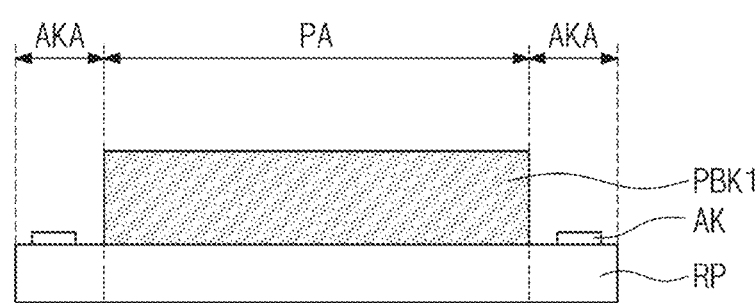

Referring to FIGS. 6C and 6D, after the operation of exposing the coating layer CL, an operation of developing may be performed. In the operation of developing the coating layer CL, the coating layer CL corresponding to the second region AA2 of the first mask MK1 may be removed. That is, the coating layer CL disposed in the align key region AKA may be removed. Accordingly, the align key AK disposed in the align key region AKA may be exposed without being covered by the coating layer CL. The coating layer CL corresponding to the first region AA1 of the first mask MK1 may remain without being removed. That is, the coating layer CL disposed in the panel region PA may remain on the substrate RP to form a preliminary first sub partition wall PBK1 illustrated in FIG. 6D.

Although not illustrated, after the operation of forming the preliminary first sub partition wall PBK1 by exposing and developing the coating layer CL, a dehydration bake process may be performed. Dehydration bake may be an operation of removing moisture remaining on the surface of the preliminary first sub partition wall PBK1 before coating a resin composition for forming a preliminary second sub partition wall PBK2. Specific conditions such as temperature and time of the dehydration process may be appropriately selected depending on the type and capacity of the material. In an embodiment, for example, the dehydration bake process may be performed at about 90° C. for about 100 seconds, but an embodiment of the invention is not limited thereto. In an alternative embodiment, the dehydration bake process may be omitted.

In an embodiment, the coating layer CL may have a light transmittance of less than about 15%. The coating layer CL may have a light transmittance of less than about 15% with respect to light in the near-infrared region. In an embodiment, for example, the coating layer CL may have a light transmittance of less than about 15% with respect to light in the wavelength range of about 750 nm to about 900 nm. Since the coating layer CL includes the scattering body SP, the coating layer CL may have a smaller light transmittance in the near-infrared region than the coating layer CL without the scattering body SP. Accordingly, when a pattern is formed after coating the coating layer CL on the substrate RP, it may not be easy to recognize the align key AK due to the small light transmittance of the coating layer CL, so that it may be difficult to form a precise pattern. According to an embodiment of the invention, when the plurality of partition walls BK are formed, the coating layer CL overlapping the align key region AKA is removed in the operation of exposing and developing the coating layer CL, thereby exposing the align key AK disposed in the align key region AKA. Accordingly, it may become easy to recognize the align key AK in the operation of exposing and developing the preliminary first sub partition wall PBK1 and the preliminary second sub partition wall PBK2 to be described later, thereby being capable of forming a precise pattern.

Figure 6E:
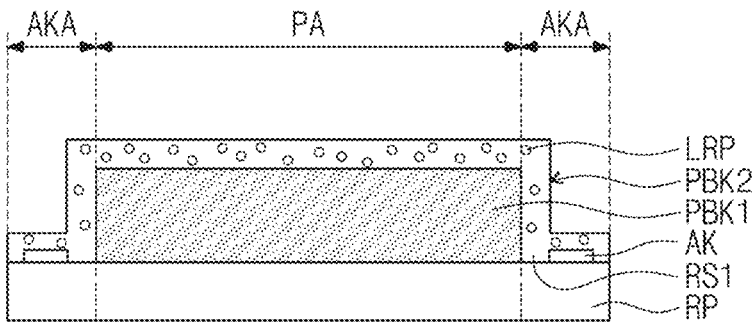

Referring to FIG. 6E, the preliminary second sub partition wall PBK2 may be provided or formed on the preliminary first sub partition wall PBK1. Since the coating layer CL corresponding to the align key region AKA is removed, the preliminary first sub partition wall PBK1 may overlap the panel region PA, and may not overlap the align key region AKA. Accordingly, a resin composition for forming the preliminary second sub partition wall PBK2 may be provided on the substrate RP to cover the align key AK, and the preliminary second sub partition wall PBK2 may be formed to cover the align key AK.

A resin composition for forming the preliminary second sub partition wall PBK2 may include a liquid repellent LRP. Specifically, the resin composition for forming the preliminary second sub partition wall PBK2 may include a first base resin RS1 and the liquid repellent LRP dispersed in the first base resin RS1. In addition, the resin composition for forming the preliminary second sub partition wall PBK2 may further include at least one photoinitiator, and the same content described in a resin composition for forming the coating layer CL described above may be applied to the photoinitiator.

In an embodiment, although not illustrated, at least one process selected from the VCD process and the pre-bake process may be performed after the operation of forming the preliminary second sub partition wall PBK2. In an embodiment, for example, after forming the preliminary second sub partition wall PBK2 on the preliminary first sub partition wall PBK1, the pre-bake process may be performed after the VCD process, but an embodiment of the invention is not limited thereto. The VCD process and the pre-bake process may be omitted in some cases.

Figure 6F:
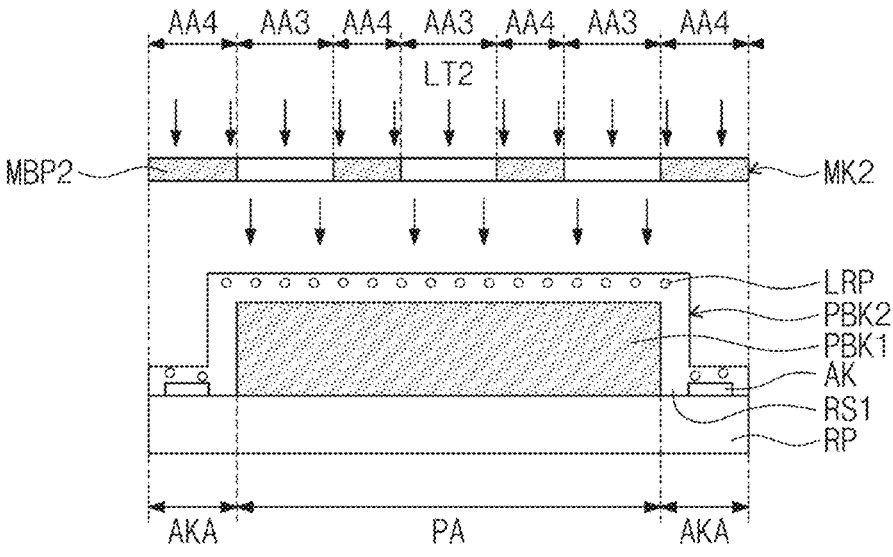

Referring to FIG. 6F, after forming the preliminary second sub partition wall PBK2 on the substrate RP, the second mask MK2 may be aligned on the substrate RP on the basis of the align key AK. The second mask MK2 may include a third region AA3 and a fourth region AA4. The second mask MK2 may include a second light-blocking part MBP2 corresponding to the fourth region AA4. The second mask MK2 may be aligned on the substrate RP on which the preliminary second sub partition wall PBK2 is formed. In such an operation, the second mask MK2 may be aligned on the substrate RP using the align key AK. In an embodiment, the position of the align key AK may be recognized on the substrate RP, and the substrate RP and the second mask MK2 may be aligned using an infrared light sensor on the basis of the position of the align key AK. The preliminary second sub partition wall PBK2 may have a light transmittance of about 15% or more in the wavelength range of about 750 nm to about 900 nm. Accordingly, since near-infrared light may be used for aligning the second mask MK2, the align key AK placed under the preliminary second sub partition wall PBK2 may be recognized.

An exposing machine may be used in the operation of aligning the substrate RP and the second mask MK2. In an embodiment, light in the near-infrared region may be transmitted from the exposing machine toward the lower surface of the substrate RP, and the light from the upper surface of the substrate RP through the lower surface of the substrate RP may be detected by an infrared light sensor of the exposing machine. Accordingly, the position of the align key AK disposed on the substrate RP may be detected. The preliminary second sub partition wall PBK2 disposed in the align key region AKA of the substrate RP may transmit near-infrared light. In the light in the wavelength range of about 750 nm to about 900 nm, since the preliminary second sub partition wall PBK2 has a light transmittance of about 15% or more, the near-infrared light transmitting the preliminary second sub partition wall PBK2 may be recognized by an infrared light sensor of the exposing machine. The align key AK may be covered by the preliminary second sub partition wall PBK2 having a high light transmittance, thereby being detected by an infrared light sensor. Accordingly, positions of the substrate RP and the second mask MK2 may be accurately aligned, thereby determining the accurate exposing position of the preliminary first sub partition wall PBK1 and the preliminary second sub partition wall PBK2.

The preliminary second sub partition wall PBK2 may include the liquid repellent LRP, and may not include the scattering body SP and the pigment PG. Accordingly, the preliminary second sub partition wall PBK2 may maintain a light transmittance in the near-infrared wavelength range of about 15% or more.

Thereafter, using the second mask MK2, an operation of exposing the preliminary first sub partition wall PBK1 and the preliminary second sub partition wall PBK2 may be performed. Second light LT2 may be radiated on the upper surface of the second mask MK2. The second light LT2 may be provided using a projection-type exposing machine. The second light LT2 may pass through the third region AA3. Accordingly, the preliminary first sub partition wall PBK1 and the preliminary second sub partition wall PBK2 each corresponding to the third region AA3 may be fully exposed. That is, the preliminary first sub partition wall PBK1 and the preliminary second sub partition wall PBK2 may be entirely exposed in the thickness direction. In addition, the second light LT2 incident onto the fourth region AA4 may be blocked by the second light-blocking part MBP2 of the second mask MK2. Accordingly, the preliminary first sub partition wall PBK1 and the preliminary second sub partition wall PBK2 each corresponding to the fourth region AA4 may not be exposed. Here, "fully exposed" means exposed with light having an energy of a critical exposing value or more.

Figure 6G:
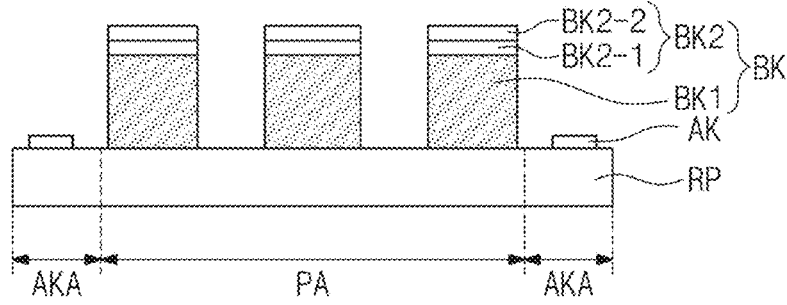

Referring to FIGS. 6F and 6G, an operation of developing the preliminary first sub partition wall PBK1 and the preliminary second sub partition wall PBK2 may be performed. In the operation of developing the preliminary first sub partition wall PBK1 and the preliminary second sub partition wall PBK2, the preliminary first sub partition wall PBK1 and the preliminary second sub partition wall PBK2 each corresponding to the third region AA3 of the second mask MK2 may be cured and remain on the substrate RP. The preliminary first sub partition wall PBK1 and the preliminary second sub partition wall PBK2 each corresponding to the fourth region AA4 of the second mask MK2 may be removed.

In addition, in the operation of exposing and developing the preliminary first sub partition wall PBK1 and the preliminary second sub partition wall PBK2, the liquid repellent LRP included in the preliminary second sub partition wall PBK2 may be phase-separated onto the preliminary second sub partition wall PBK2. Specifically, in the operation of exposing the preliminary first sub partition wall PBK1 and the preliminary second sub partition wall PBK2, in a state of being phase-separated, the liquid repellent LRP may be cured onto the preliminary second sub partition wall PBK2 and be fixed. Accordingly, the preliminary second sub partition wall PBK2 may be phase-separated into a preliminary second layer including most of the liquid repellent LRP, and a preliminary first layer not including the liquid repellent LRP or including only a very small amount of the liquid repellent LRP. The preliminary second layer may be exposed, and, as illustrated in FIG. 6G, etc., may form a second layer BK2-2 of the second sub partition wall BK2 including the liquid repellent LRP. The preliminary first layer may be exposed, and, as illustrated in FIG. 6G, etc., may form the first layer BK2-1 not including the liquid repellent LRP or including only a very small amount of the liquid repellent LRP.

However, an embodiment of the invention is not limited thereto, and an operation of baking the preliminary second sub partition wall PBK2 may be performed before the operation of exposing and developing the preliminary first sub partition wall PBK1 and the preliminary second sub partition wall PBK2. While baking the preliminary second sub partition wall PBK2, the liquid repellent LRP may be phase-separated onto the preliminary second sub partition wall PBK2.

Referring to FIG. 6G, a partition wall BK pattern may be formed after the operation of exposing and developing in FIG. 6F. That is, the partition wall BK may be formed to include the first sub partition wall BK1 having a relatively low light transmittance and the second sub partition wall BK2 having a relatively higher light transmittance than the first sub partition wall BK1. The first sub partition wall BK1 may include the scattering body SP (see FIG. 3C) and the pigment PG (see FIG. 3C) dispersed in the second base resin RS2 (see FIG. 3C). The second sub partition wall BK2 may include the liquid repellent LRP (see FIG. 3C) dispersed in the first base resin RS1. The second sub partition wall BK2 may not include the scattering body SP (see FIG. 3C) and the pigment PG (see FIG. 3C). The second sub partition wall BK2 not including the scattering body SP (see FIG. 3C) and the pigment PG (see FIG. 3C) may have a higher light transmittance than the first sub partition wall BK1 including the scattering body SP (see FIG. 3C) and the pigment PG (see FIG. 3C).

Although not illustrated, after the operation of exposing and developing the preliminary first sub partition wall PBK1 and the preliminary second sub partition wall PBK2, a post-bake (POB) process may be performed. Specific conditions such as temperature and time of the post-bake process may be appropriately selected depending on the type and capacity of the material. However, an embodiment of the invention is not limited thereto, and the post-bake process may be omitted in some cases.

In FIGS. 6A to 6G, an embodiment where a negative type photoresist method, in which a film on an unexposed portion is removed, is used, is exemplarily illustrated, but an embodiment of the invention is not limited thereto. In an alternative embodiment, a positive type photoresist method, in which a film on an exposed portion is removed, may be used.

Figure 6H:
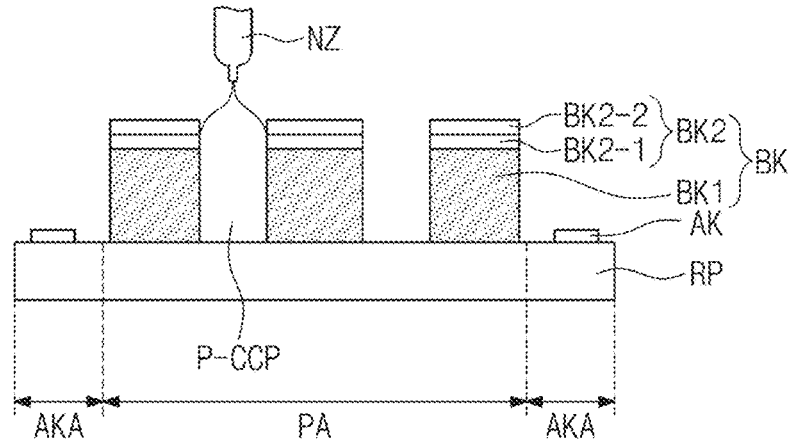

FIG. 6H illustrates an operation of providing a color control part resin P-CCP between the partition walls BK. The color control part resin P-CCP may be provided between the partition walls BK, and may be provided only to the space between the partition walls BK without diffusing onto the second layer BK2-2 of the second sub partition wall BK2. That is, since the surface energy of the second layer BK2-2 of the second sub partition wall BK2 is lower than the surface energy of the color control part resin P-CCP, the color control part resin P-CCP may be provided or placed only in the space between the partition walls BK without diffusing onto the second layer BK2-2 of the second sub partition wall BK2, or color-mixing with a neighboring color control part resin P-CCP.

In an embodiment, since the surface energy of the first sub partition wall BK1 and the surface energy of the first layer BK2-1 of the second sub partition wall BK2 are higher than the surface energy of the color control part resin P-CCP, the color control part resin P-CCP may be wet to the side surface of the first sub partition wall BK1 and the side surface of the first layer BK2-1 of the second sub partition wall BK2 with a high adhesion.

The color control part resin P-CCP may be provided through a nozzle NZ. In an embodiment, for example, the operation of providing the color control part resin P-CCP may provide the color control part resin P-CCP through an inkjet printing method.

The configuration of the color conversion member CCM according to an embodiment is not limited to those described above with reference to FIGS. 3A to 6H. In an embodiment, for example, the shape of the partition wall BK may be changed in the range including the first sub partition wall BK1 and the second sub partition wall BK2 including the first layer BK2-1 and the second layer BK2-2.

Conventionally, for sufficiently maintain light-blocking properties of a partition wall and simultaneously increasing light-emitting efficiency of a partition wall, a method of mixing a light-blocking pigment and a scattering body has been applied. However, since an accurate alignment between a photoresist substrate and a mask is difficult with the method in forming a partition wall pattern, there is a limitation in that an alignment error occurs.

In an embodiment of the invention, the display device DD includes the partition wall BK including the first sub partition wall BK1 and the second sub partition wall BK2 having light transmittances different from each other, it may be easy to recognize the align key AK. In such an embodiment, the second sub partition wall BK2 has a higher light transmittance than the first sub partition wall BK1, thereby contributing to determining an accurate exposing position for forming the partition wall BK. Accordingly, process reliability of the display device DD may be improved. In such an embodiment, the first sub partition wall BK1 of the partition wall BK may be provided with the scattering body SP in a high concentration regardless of infrared light transmittance, thereby increasing light-emitting efficiency of the display device DD. In such an embodiment, since the second sub partition wall BK2 is disposed on the first sub partition wall BK1, the film durability and the chemical resistance of the display device DD may be improved by suppressing an afterimage expression caused by the dissolution of a pigment.

According to a display panel according to an embodiment of the invention, a partition wall included in a light control layer may include a first sub partition wall and a second sub partition wall having light transmittances different from each other, thereby improving light conversion efficiency of the light control layer, and improving film durability and chemical resistance. Accordingly, display efficiency and reliability of the display panel including the light control layer may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel; and
a color conversion member disposed on the display panel, wherein
the color conversion member comprises a plurality of partition walls disposed on the display panel, and spaced apart from each other, and
a color control part disposed between the plurality of partition walls,
each of the plurality of partition walls comprises
a first sub partition wall including a scattering body, and
a second sub partition wall disposed on the first sub partition wall, and including a liquid repellent, and
the second sub partition wall has a higher light transmittance than the first sub partition wall.

2. The display device of claim 1, wherein the second sub partition wall comprises:
a first layer adjacent to the first sub partition wall, and including a first base resin; and
a second layer disposed on the first layer, and including the first base resin and the liquid repellent.

3. The display device of claim 1, wherein
the first sub partition wall has a height of about 5 μm to about 15 μm in a thickness direction of the display panel, and
the second sub partition wall has a height of about 0.5 μm to about 5 μm in the thickness direction of the display panel.

4. The display device of claim 1, wherein the scattering body has a weight of about 5 wt % to about 30 wt % with respect to a total weight of the first sub partition wall.

5. The display device of claim 1, wherein the first sub partition wall further comprises a pigment.

6. The display device of claim 5, wherein the pigment has a weight of about 0.5 wt % to about 5 wt % with respect to a total weight of the first sub partition wall.

7. The display device of claim 5, wherein the first sub partition wall further comprises a second base resin in which the scattering body and the pigment are dispersed.

8. The display device of claim 1, wherein the second sub partition wall does not comprise the scattering body and a pigment.

9. The display device of claim 1, wherein the second sub partition wall has a light transmittance of about 15% or more for light in a wavelength range of about 750 nm to about 900 nm.

10. The display device of claim 1, wherein the liquid repellent comprises fluorine.

11. The display device of claim 1, wherein
the display panel comprises a light-emitting element which emits first color light, and
the color control part comprises:
a first color control part including first quantum dots which convert the first color light to second color light having a longer wavelength range than the first color light;
a second color control part including second quantum dots which convert the first color light to third color light having a longer wavelength range than the first color light and the second color light; and
a third color control part which transmits the first color light.

12. The display device of claim 11, wherein the color conversion member further comprises a color filter layer disposed on the color control part, and
the color filter layer comprises:
a first color filter part which transmits the second color light;
a second color filter part which transmits the third color light;
a third color filter part which transmits the first color light; and a light-blocking part disposed between the first to third color filter parts.

13. A display device comprising:

a display panel; and a color conversion member disposed on the display panel, wherein the color conversion member comprises a plurality of partition walls disposed on the display panel, and spaced apart from each other, and each of the plurality of partition walls comprises a first sub partition wall including a scattering body and a pigment, and a second sub partition wall disposed on the first sub partition wall, including a liquid repellent, and not including the scattering body and the pigment.

14. A manufacturing method of a display device, the method comprising:

preparing a substrate; and providing a plurality of partition walls on the substrate, wherein the providing the plurality of partition walls comprises providing a coating layer including a scattering body, forming a preliminary first sub partition wall by exposing and developing the coating layer, providing, on the preliminary first sub partition wall, a preliminary second sub partition wall including a liquid repellent, and exposing and developing the preliminary first partition wall and the preliminary second sub partition wall, and the preliminary second sub partition wall has a higher light transmittance than the preliminary first sub partition wall.

15. The manufacturing method of claim 14, wherein the preparing the substrate comprises providing an align key on the substrate, and the providing the coating layer comprises providing the coating layer to cover the align key.

16. The manufacturing method of claim 15, wherein the forming the preliminary first sub partition wall comprises exposing the align key by exposing and developing the coating layer.

17. The manufacturing method of claim 16, wherein the providing the preliminary second sub partition wall comprises providing the preliminary second sub partition wall to cover the align key.

18. The manufacturing method of claim 17, further comprising:

aligning mask patterns on the substrate using the align key, before the exposing and developing the preliminary first sub partition wall and the preliminary second sub partition wall.

19. The manufacturing method of claim 14, wherein the preliminary second sub partition wall has a light transmittance of about 15% or more for light in a wavelength range of about 750 nm to about 900 nm.

20. The manufacturing method of claim 14, wherein in the exposing and developing the preliminary first sub partition wall and the preliminary second sub partition wall, the liquid repellent is phase-separated onto the preliminary second sub partition wall.

* * * * *